United States Patent [19]
Shimote et al.

[11] Patent Number: 5,212,677
[45] Date of Patent: May 18, 1993

[54] DEFECT INSPECTING APPARATUS FOR DISC-SHAPED INFORMATION RECORDING MEDIA

[75] Inventors: Yuuji Shimote; Mitsuo Fukuda; Masafumi Ototake; Koji Shindo, all of Amagasaki, Japan

[73] Assignee: Mitsubishi Denki Kabushiki Kaisha, Tokyo, Japan

[21] Appl. No.: 522,259

[22] Filed: May 11, 1990

[30] Foreign Application Priority Data

May 11, 1989 [JP] Japan .................................. 1-117911
May 23, 1989 [JP] Japan .................................. 1-129304
Apr. 17, 1990 [JP] Japan .................................. 2-102031

[51] Int. Cl.⁵ .................... G11B 7/00; G11B 27/36; G11B 3/90
[52] U.S. Cl. ...................... 369/58; 360/31; 369/53; 369/32; 369/59
[58] Field of Search .............. 369/54, 58, 59, 32, 369/53; 371/40.1; 358/339, 106; 360/31, 38.1

[56] References Cited

U.S. PATENT DOCUMENTS 4,686,563 8/1987 Fountain et al. ............... 360/38.1
4,896,227 1/1990 Fountain et al. ............... 360/31

FOREIGN PATENT DOCUMENTS 61-208627 9/1986 Japan .
64-72087 3/1989 Japan .

Primary Examiner—Robert L. Richardson
Assistant Examiner—Nabih Hindi
Attorney, Agent, or Firm—Wolf, Greenfield & Sacks

[57] ABSTRACT

An apparatus which inspects disc-shaped information recording media, such as optical disks and magnetic disks, in a single reproduction. The apparatus detects the type of defect and classifies the defects into defect clusters by the defect position in the radial and circumferential directions. Type of defect or defect cluster, position and size are memorized.

10 Claims, 29 Drawing Sheets

USER AREA DEFECT OR UNFORMATTED DISK DEFECT

FLAG AREA DEFECT

SFP HEADER ERROR (USER AREA, CONTROL TRACK AREA)

SFP CONTROL TRACK DATA ERROR

SFP CONTROL TRACK SYNC, RESYNC ERROR

Fig. 15

| SIZE, TYPE BITS | TYPE OF DEFECT | USER AREA DEFECT, UNFORMAT DISK DEFECT | FLAG AREA DEFECT | HEADER SM ERROR | HEADER CRC1 ERROR | HEADER CRC2 ERROR | HEADER CRC3 ERROR | SFP CONTROL TRACK DATA ERROR | SFP CONTROL TRACK SYNC ERROR | SFP CONTROL TRACK RESYNC ERROR |
|---|---|---|---|---|---|---|---|---|---|---|
| 0 | | — | — | 1 | 0 | 0 | 0 | — | 1 | 0 |
| 1 | | — | — | 0 | 1 | 0 | 0 | — | 0 | 1 |
| 2 | | — | — | 0 | 0 | 1 | 0 | — | — | — |
| 3 | | — | — | 0 | 0 | 0 | 1 | — | — | — |
| 4 | | — | — | — | — | — | — | — | — | — |
| 5 | | — | — | — | — | — | — | — | — | — |
| 6 | | — | — | — | — | — | — | — | — | — |
| 7 | | — | — | — | — | — | — | — | — | — |
| 8 | | — | — | — | — | — | — | — | — | — |
| 9 | | — | — | — | — | — | — | — | — | — |
| A | | — | — | — | — | — | — | — | — | — |
| B | | — | — | — | — | — | — | — | — | — |
| C | | 0 | 0 | 0 | 0 | 0 | 0 | 0 | 1 | 1 |
| D | | 0 | 0 | 0 | 0 | 0 | 0 | 1 | 0 | 0 |
| E | | 0 | 1 | 0 | 0 | 0 | 0 | 0 | 0 | 0 |
| F | | 0 | 0 | 1 | 1 | 1 | 0 | 0 | 0 | 0 |

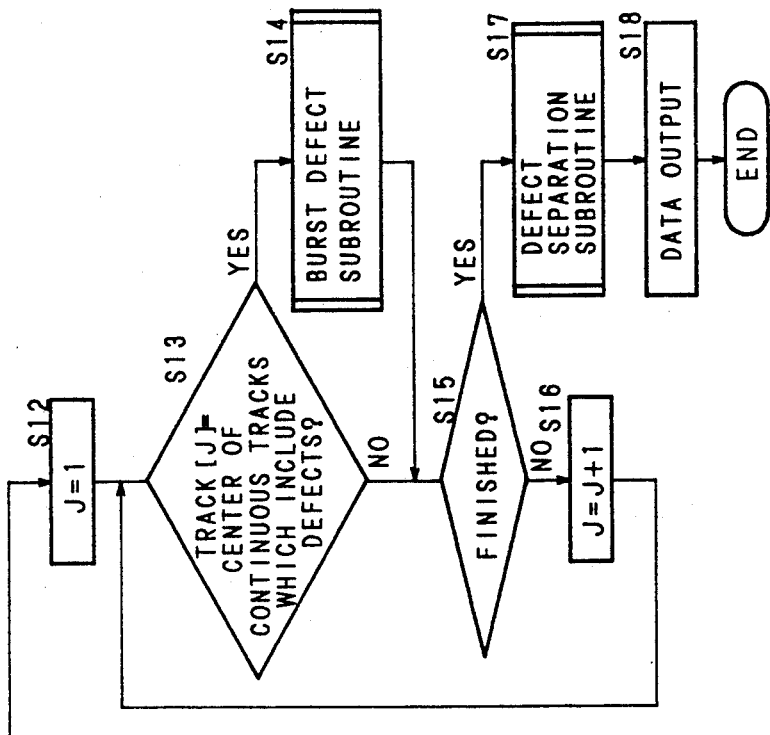
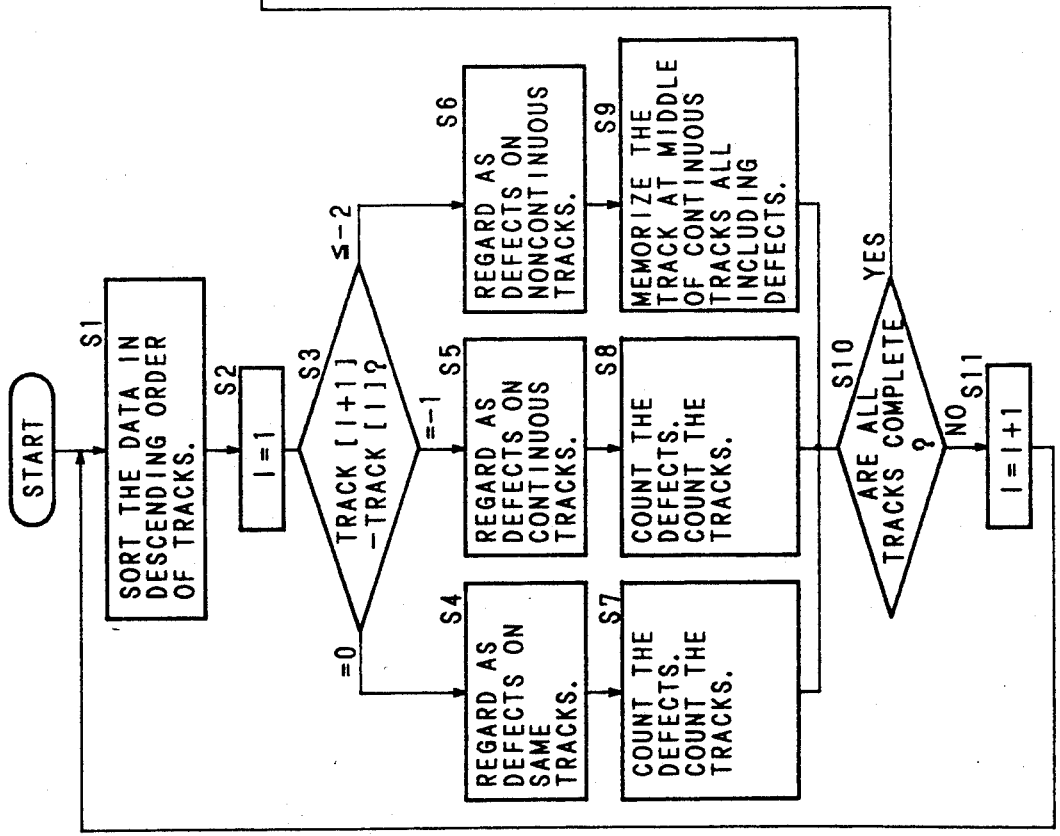
Fig. 18

Fig. 23

| No. | SIZE | CLASS | TRACK | ANGLE | R (mm) |
|---|---|---|---|---|---|
| 1 | 19 | M | 17125 | 171.8 | 55.90 |
| 2 | 18 | M | 17122 | 172.9 | 55.90 |
| 3 | 18 | M | 17123 | 172.9 | 55.90 |
| 4 | 18 | M | 17124 | 172.9 | 55.90 |
| 5 | 18 | M | 17126 | 172.8 | 55.90 |
| 6 | 17 | M | 9005 | 341.0 | 42.91 |
| 7 | 17 | M | 9006 | 341.0 | 42.91 |
| 8 | 17 | M | 17127 | 172.9 | 55.90 |
| 9 | 17 | M | 17128 | 172.9 | 55.90 |
| 10 | 17 | M | 17129 | 172.8 | 55.91 |
| 11 | 16 | M | 9004 | 341.0 | 42.91 |
| 12 | 16 | M | 9007 | 341.0 | 42.91 |
| 13 | 16 | M | 17118 | 172.8 | 55.89 |
| 14 | 16 | M | 17130 | 172.8 | 55.91 |
| 15 | 16 | M | 17131 | 172.9 | 55.91 |
| 16 | 15 | M | 2851 | 306.6 | 33.06 |
| 17 | 15 | M | 2853 | 306.7 | 33.06 |
| 18 | 15 | M | 2855 | 306.6 | 33.07 |
| 19 | 15 | M | 9008 | 341.0 | 42.91 |
| 20 | 15 | M | 17117 | 172.8 | 55.89 |
| 21 | 15 | M | 17119 | 172.9 | 55.89 |
| 22 | 15 | M | 17120 | 172.8 | 55.89 |
| 23 | 15 | M | 17121 | 172.8 | 55.89 |
| 24 | 15 | M | 18411 | 341.0 | 57.96 |
| 25 | 14 | M | 2850 | 306.6 | 33.06 |
| 26 | 14 | M | 2852 | 306.6 | 33.06 |
| 27 | 14 | M | 2854 | 306.6 | 33.07 |
| 28 | 14 | M | 2856 | 306.6 | 33.07 |
| 29 | 14 | M | 2857 | 306.6 | 33.07 |
| 30 | 14 | M | 2858 | 306.6 | 33.07 |
| 31 | 14 | M | 9003 | 341.0 | 42.90 |
| 32 | 14 | M | 9009 | 341.0 | 42.91 |
| 33 | 14 | M | 17116 | 172.8 | 55.89 |
| 34 | 13 | M | 2251 | 255.4 | 32.10 |
| 35 | 13 | M | 2859 | 306.6 | 33.07 |
| 36 | 13 | M | 17115 | 172.9 | 55.88 |
| 37 | 13 | M | 17132 | 172.9 | 55.91 |
| 38 | 12 | M | 2250 | 255.3 | 32.10 |
| 39 | 12 | M | 2849 | 306.6 | 33.08 |
| 40 | 12 | M | 2860 | 306.6 | 33.08 |
| 41 | 12 | M | 9010 | 341.0 | 42.92 |
| 42 | 11 | M | 2249 | 255.3 | 32.10 |
| 43 | 11 | M | 2252 | 255.4 | 32.10 |
| 44 | 11 | M | 2848 | 306.6 | 33.06 |
| 45 | 11 | M | 17114 | 172.9 | 55.88 |
| 46 | 10 | M | 2248 | 255.4 | 32.10 |
| 47 | 10 | M | 2253 | 255.4 | 32.10 |
| 48 | 10 | M | 6067 | 175.7 | 38.21 |
| 49 | 10 | M | 6068 | 175.8 | 38.21 |
| 50 | 10 | M | 9011 | 341.0 | 42.92 |
| 51 | 10 | M | 11953 | 35.0 | 47.62 |
| 52 | 10 | M | 11954 | 34.9 | 47.62 |
| 53 | 10 | M | 17133 | 172.8 | 55.91 |

Fig. 24

| | No. | SIZE | CLASS | TRACK | ANGLE | R (mm) |
|---|---|---|---|---|---|---|
| 1-BIT DEFECT | 1 | 15 | M | 18411 | 341.0 | 57.96 |
| CLUSTER DEFECTS | 2 | 10 | M | 17133 | 172.8 | 55.91 |
| | 3 | 13 | M | 17132 | 172.9 | 55.91 |
| | 4 | 16 | M | 17131 | 172.9 | 55.91 |
| | 5 | 16 | M | 17130 | 172.8 | 55.91 |
| | 6 | 17 | M | 17129 | 172.8 | 55.91 |
| | 7 | 17 | M | 17128 | 172.9 | 55.90 |
| | 8 | 17 | M | 17127 | 172.9 | 55.90 |
| | 9 | 18 | M | 17126 | 172.8 | 55.90 |
| | 10 | 19 | M | 17125 | 172.8 | 55.90 |
| | 11 | 18 | M | 17124 | 172.9 | 55.90 |
| | 12 | 18 | M | 17123 | 172.9 | 55.90 |
| | 13 | 18 | M | 17122 | 172.9 | 55.90 |
| | 14 | 15 | M | 17121 | 172.8 | 55.89 |
| | 15 | 15 | M | 17120 | 172.8 | 55.89 |
| | 16 | 15 | M | 17119 | 172.9 | 55.89 |
| | 17 | 16 | M | 17118 | 172.8 | 55.89 |
| | 18 | 15 | M | 17117 | 172.8 | 55.89 |
| | 19 | 14 | M | 17116 | 172.8 | 55.89 |
| | 20 | 13 | M | 17115 | 172.9 | 55.88 |
| | 21 | 11 | M | 17114 | 172.9 | 55.88 |
| CLUSTER DEFECTS | 22 | 10 | M | 11954 | 34.9 | 47.62 |
| | 23 | 10 | M | 11953 | 35.0 | 47.62 |
| CLUSTER DEFECTS | 24 | 10 | M | 9011 | 341.0 | 42.92 |
| | 25 | 12 | M | 9010 | 341.0 | 42.92 |
| | 26 | 14 | M | 9009 | 341.0 | 42.91 |
| | 27 | 15 | M | 9008 | 341.1 | 42.91 |
| | 28 | 16 | M | 9007 | 341.0 | 42.91 |
| | 29 | 17 | M | 9006 | 341.0 | 42.91 |
| | 30 | 17 | M | 9005 | 341.0 | 42.91 |
| | 31 | 16 | M | 9004 | 341.0 | 42.91 |
| | 32 | 14 | M | 9003 | 341.0 | 42.90 |
| CLUSTER DEFECTS | 33 | 10 | M | 6068 | 175.8 | 38.21 |
| | 34 | 10 | M | 6067 | 175.7 | 38.21 |
| CLUSTER DEFECTS | 35 | 12 | M | 2860 | 306.6 | 33.08 |
| | 36 | 13 | M | 2859 | 341.0 | 33.07 |
| | 37 | 14 | M | 2858 | 341.0 | 33.07 |
| | 38 | 14 | M | 2857 | 341.0 | 33.07 |
| | 39 | 14 | M | 2856 | 341.0 | 33.07 |
| | 40 | 15 | M | 2855 | 341.0 | 33.07 |
| | 41 | 14 | M | 2854 | 341.0 | 33.07 |
| | 42 | 15 | M | 2853 | 306.7 | 33.06 |
| | 43 | 14 | M | 2852 | 306.6 | 33.06 |
| | 44 | 15 | M | 2851 | 306.6 | 33.06 |
| | 45 | 14 | M | 2850 | 306.6 | 33.06 |
| | 46 | 12 | M | 2849 | 306.6 | 33.08 |
| | 47 | 11 | M | 2848 | 306.6 | 33.06 |
| CLUSTER DEFECTS | 48 | 10 | M | 2253 | 255.4 | 32.10 |
| | 49 | 11 | M | 2252 | 255.4 | 32.10 |
| | 50 | 13 | M | 2251 | 255.4 | 32.10 |
| | 51 | 12 | M | 2250 | 255.3 | 32.10 |
| | 52 | 11 | M | 2249 | 255.3 | 32.10 |
| | 53 | 10 | M | 2248 | 255.4 | 32.10 |

Fig. 25

| | No. | SIZE | CLASS | TRACK | ANGLE | R (mm) |
|---|---|---|---|---|---|---|
| 1-BIT DEFECT | 1 | 15 | M | 18411 | 341.0 | 57.96 |
| CLUSTER DEFECTS | No. | SIZE | CLASS | TRACK | ANGLE | R (mm) |
| | 1 | 13 | M | 17132 | 172.9 | 55.91 |
| | 2 | 16 | M | 17131 | 172.9 | 55.91 |
| | 3 | 17 | M | 17128 | 172.9 | 55.90 |
| | 4 | 17 | M | 17127 | 172.9 | 55.90 |
| | 5 | 18 | M | 17124 | 172.9 | 55.90 |
| | 6 | 18 | M | 17123 | 172.9 | 55.90 |
| | 7 | 18 | M | 17122 | 172.9 | 55.90 |
| | 8 | 15 | M | 17119 | 172.9 | 55.89 |
| | 9 | 13 | M | 17115 | 172.9 | 55.88 |
| | 10 | 11 | M | 17114 | 172.9 | 55.88 |
| | 11 | 10 | M | 17133 | 172.8 | 55.91 |
| | 12 | 16 | M | 17130 | 172.8 | 55.91 |
| | 13 | 18 | M | 17129 | 172.8 | 55.91 |
| | 14 | 17 | M | 17126 | 172.8 | 55.90 |
| | 15 | 19 | M | 17125 | 172.8 | 55.90 |
| | 16 | 15 | M | 17121 | 172.8 | 55.89 |
| | 17 | 15 | M | 17120 | 172.8 | 55.89 |
| | 18 | 16 | M | 17118 | 172.8 | 55.89 |
| | 19 | 15 | M | 17117 | 172.8 | 55.89 |
| | 20 | 14 | M | 17116 | 172.8 | 55.89 |
| CLUSTER DEFECTS | No. | SIZE | CLASS | TRACK | ANGLE | R (mm) |
| | 1 | 10 | M | 11953 | 35.0 | 47.62 |
| | 2 | 10 | M | 11954 | 34.9 | 47.62 |
| CLUSTER DEFECTS | No. | SIZE | CLASS | TRACK | ANGLE | R (mm) |
| | 1 | 15 | M | 9008 | 341.1 | 42.91 |
| | 2 | 10 | M | 9011 | 341.0 | 42.92 |
| | 3 | 12 | M | 9010 | 341.0 | 42.92 |
| | 4 | 14 | M | 9009 | 341.0 | 42.91 |
| | 5 | 16 | M | 9007 | 341.0 | 42.91 |
| | 6 | 17 | M | 9006 | 341.0 | 42.91 |
| | 7 | 17 | M | 9005 | 341.0 | 42.91 |
| | 8 | 16 | M | 9004 | 341.0 | 42.91 |
| | 9 | 14 | M | 9003 | 341.0 | 42.90 |
| CLUSTER DEFECTS | No. | SIZE | CLASS | TRACK | ANGLE | R (mm) |
| | 1 | 10 | M | 6068 | 175.8 | 38.21 |
| | 2 | 10 | M | 6067 | 175.7 | 38.21 |
| CLUSTER DEFECTS | No. | SIZE | CLASS | TRACK | ANGLE | R (mm) |
| | 1 | 15 | M | 2853 | 306.7 | 33.06 |
| | 2 | 12 | M | 2860 | 306.6 | 33.08 |
| | 3 | 13 | M | 2859 | 306.6 | 33.07 |
| | 4 | 14 | M | 2858 | 306.6 | 33.07 |
| | 5 | 14 | M | 2857 | 306.6 | 33.07 |
| | 6 | 14 | M | 2856 | 306.6 | 33.07 |
| | 7 | 15 | M | 2855 | 306.6 | 33.07 |
| | 8 | 14 | M | 2854 | 306.6 | 33.07 |
| | 9 | 14 | M | 2852 | 306.6 | 33.06 |
| | 10 | 15 | M | 2851 | 306.6 | 33.06 |
| | 11 | 14 | M | 2850 | 306.6 | 33.06 |
| | 12 | 12 | M | 2849 | 306.6 | 33.08 |
| | 13 | 11 | M | 2848 | 306.6 | 33.06 |
| CLUSTER DEFECTS | No. | SIZE | CLASS | TRACK | ANGLE | R (mm) |
| | 1 | 10 | M | 2253 | 255.4 | 32.10 |
| | 2 | 11 | M | 2252 | 255.4 | 32.10 |
| | 3 | 13 | M | 2251 | 255.4 | 32.10 |
| | 4 | 10 | M | 2248 | 255.4 | 32.10 |
| | 5 | 12 | M | 2250 | 255.3 | 32.10 |
| | 6 | 11 | M | 2249 | 255.3 | 32.10 |

\*:BURST DEFECTS
NUMBER:SECTOR NO.

Fig. 27

| No. | SIZE (max) | TRACK (center) | TRACK (cross) | ANGLE (center) | R (mm) |
|---|---|---|---|---|---|
| 1 | 19 | 17123 | 20 | 172.9 | 55.90 |
| 2 | 17 | 9007 | 9 | 341.0 | 42.92 |
| 3 | 15 | 18411 | 1 | 341.0 | 57.96 |
| 4 | 15 | 2854 | 17 | 306.6 | 33.07 |
| 5 | 13 | 2250 | 6 | 255.4 | 32.10 |
| 6 | 10 | 11953 | 2 | 35.0 | 47.62 |
| 7 | 10 | 6067 | 2 | 175.5 | 38.21 |

Fig. 28

| No. | SIZE | CLASS | TRACK | ANGLE | R (mm) |
|---|---|---|---|---|---|
| 1 | 19 | M | 103 | 93.5 | 31.60 |
| 2 | 19 | M | 104 | 93.5 | 31.60 |
| 3 | 18 | M | 105 | 93.5 | 31.60 |
| 4 | 17 | M | 102 | 93.6 | 31.59 |
| 5 | 17 | M | 105 | 240.7 | 31.60 |
| 6 | 17 | M | 106 | 93.6 | 31.60 |
| 7 | 17 | M | 106 | 240.7 | 31.60 |
| 8 | 16 | M | 104 | 240.7 | 31.60 |
| 9 | 16 | M | 107 | 240.7 | 31.61 |
| 10 | 16 | M | 108 | 240.7 | 31.61 |
| 11 | 15 | M | 101 | 93.5 | 31.59 |
| 12 | 14 | M | 103 | 240.6 | 31.60 |

Fig. 29

| No. | SIZE | CLASS | TRACK | ANGLE | R (mm) |
|---|---|---|---|---|---|
| 1 | 16 | M | 108 | 240.7 | 31.61 |
| 2 | 16 | M | 107 | 240.7 | 31.61 |
| 3 | 17 | M | 106 | 93.6 | 31.60 |
| 4 | 17 | M | 106 | 240.7 | 31.60 |
| 5 | 18 | M | 105 | 93.5 | 31.60 |
| 6 | 17 | M | 105 | 240.7 | 31.60 |
| 7 | 19 | M | 104 | 93.5 | 31.60 |
| 8 | 16 | M | 104 | 240.7 | 31.60 |
| 9 | 19 | M | 103 | 93.5 | 31.60 |
| 10 | 14 | M | 103 | 240.6 | 31.60 |
| 11 | 17 | M | 102 | 93.6 | 31.59 |
| 12 | 15 | M | 101 | 93.5 | 31.59 |

Fig. 30

| CLUSTER DEFECT | No. | SIZE | CLASS | TRACK | ANGLE | R (mm) |
|---|---|---|---|---|---|---|
| | 1 | 16 | M | 108 | 240.7 | 31.61 |
| | 2 | 16 | M | 107 | 240.7 | 31.61 |
| | 3 | 17 | M | 106 | 240.7 | 31.60 |
| | 4 | 17 | M | 105 | 240.7 | 31.60 |
| | 5 | 16 | M | 104 | 240.7 | 31.60 |
| | 6 | 14 | M | 103 | 240.6 | 31.60 |

| CLUSTER DEFECT | No. | SIZE | CLASS | TRACK | ANGLE | R (mm) |
|---|---|---|---|---|---|---|
| | 1 | 17 | M | 106 | 93.6 | 31.60 |
| | 2 | 17 | M | 102 | 93.6 | 31.59 |
| | 3 | 18 | M | 105 | 93.5 | 31.60 |
| | 4 | 19 | M | 104 | 93.5 | 31.60 |
| | 5 | 19 | M | 103 | 93.5 | 31.60 |
| | 6 | 15 | M | 101 | 93.5 | 31.59 |

DEFECT INSPECTING APPARATUS FOR DISC-SHAPED INFORMATION RECORDING MEDIA

DESCRIPTION OF RELEVANT ART

1. Field of the Invention

The present invention relates to a defect inspecting apparatus for disc-shaped information recording media such as optical disks, magnetic disks and optical magnetic disks.

2. Prior Art

In a disc-shaped information recording medium such as an optical disk, a signal is recorded on tracks formed in a spiral shape or in concentric circles. For this reason, burst defects, which are clusters of defects occurring in a part of the medium covering a plurality of adjacent tracks, may exist in a disc-shaped information recording medium, in contrast to the case of a magnetic tape where the signals are recorded on straight line tracks.

FIG. 1 shows a disc-shaped information recording medium having burst defects thereon. In this example, a spiral track is formed on a disc-shaped information recording medium 51, and burst defect 52a, which covers five tracks, and burst defect 52b, which covers two tracks, exist. When reproduction signals are obtained from a disc-shaped information recording medium which has such defects, seven drop-out pulses, P1 through P7, will be detected, as shown in FIG. 2.

By detecting only the drop-out pulses, only the number of defects on the tracks of the disc-shaped information recording medium can be determined. The existence of cluster-like burst defects and their number and positions remain unknown. For this reason, inspection of burst defects has often been carried out by operators who inspect the recording medium visually by means of microscopes or the like.

For the purpose of detecting such burst defects, the invention of Japanese Patent Publication No. 63-27779, for example, has been proposed. The invention of Japanese Patent Publication No. 63-27779 is constituted of the circuits shown in FIG. 3, and signals are processed as shown in the timing chart of FIG. 4.

In FIG. 3, an input terminal 53 requires the reproduction signal from the disc-shaped information recording medium. The reproduction signal includes the drop-out pulse a as shown in FIG. 4(A). The drop-out pulse a is fed to a flip-flop 54.

Upon input of the drop-out pulse a to the input terminal 53, the flip-flop 54 is switched to set status as shown in FIG. 4(B), with its output signal being switched to a high level.

Upon input of a high level output signal b from the flip-flop 54, a counter 55 counts clock pulses CL which are fed through a terminal 56. When the count reaches a preset number, specifically a number which corresponds to a period of time slightly less than the period from the generation of the first drop-out pulse a to the time the disk has made a full turn, the counter 55 outputs a count complete output signal. Upon receipt of the count complete signal, a monostable multivibrator 57 is triggered and generates a rotary position pulse d of a specified width, as shown in FIG. 4(D). The rotary position pulse d is fed to a flip-flop 58 and a monostable multivibrator 59.

Upon receipt of the rotary position pulse d, the monostable multivibrator 59 provides an output pulse c as shown in FIG. 4(C) to a reset terminal of the flip-flop 54. This resets the flip-flop 54, as shown in FIG. 4(B), and stops the counting operation of the counter 55. The pulse c from the monostable multivibrator 59 is also fed to a counter 60.

When the next drop-out pulse a' is fed to the input terminal 53 when the rotary position pulse d output from the monostable multivibrator 57 is at a high level, the flip-flop 54 is set again, and the counter 55 starts counting. The flip-flop 58 is set in synchronization with the off edge of the output pulse d of the monostable multivibrator 57, thereby providing an output signal e as shown in FIG. 4(E). The state of the flip-flop 58 is determined by the signals d and b; namely it is set if the signal b is at a high level when the signal d goes low, and it is reset if the signal b is at a low level when the signal d goes low.

When the drop-out disappears at a point when the disk has made three revolutions from the first drop-out, the flip-flop 54 is held in the reset status by the output pulse c from the monostable multivibrator 59, and the flip-flop 58 is reset by the off edge of the signal d and the low level of the signal b. Resetting of the flip-flop 58 causes the monostable multivibrator 61 to output a drop-out end signal f as shown in FIG. 4(F).

As described above, the output pulse c from the monostable multivibrator 59 is fed to the counter 60 which counts the number of the output pulses c, which represents the number of continuous tracks which include drop-outs. The count of the counter 60 is sent to a gate circuit 66 which is triggered by an output signal from the monostable multivibrator 61. In this configuration, upon output of the drop-out end signal f, the gate circuit 66 gives an output which represents the number of continuous tracks which include drop-outs.

In this circuit, the output from the gate circuit 66 indicates not the number of continuous tracks itself but the relative magnitude of the number. The gate circuit 66 classifies the numbers into three levels and gives an output signal from a terminal 66a, 66b or 66c depending on the level. The drop-out end signal f is provided to the counter 60 as a reset signal via a delay circuit 68.

As described above, in the invention of Japanese Patent Publication No. 63-27779, the rotary position pulse d is generated by drop-outs and, if a drop-out pulse a exists corresponding thereto, the presence of so-called burst defects, which are a series of defects in a cluster in the radial direction of the disk, is detected.

However, according to the invention of Japanese Patent Publication No. 63-27779 described above, when a plurality of defects exist on the same track, only one of the defects on the track can be detected with the circuit described above. Therefore it is necessary to provide a plurality of sets of the circuit, or otherwise to carry out a plurality of inspections by shifting the timing of drop-out detection to detect a plurality of defects on the same track. The circuit is also not capable of detecting the magnitude of the burst defect or the circumferential length of the burst defect on the disc-shaped information recording medium.

The invention of Japanese Patent Publication No. 64-72087 proposes a method of inspection which determines the positions of drop-outs on a magnetic disk. The method is to determine the angular position (position in circumferential direction) and the radial position of the drop-out and, with this positional information stored in memory, to control the position of the magnetic disk with respect to an inspection apparatus such as a microscope, in accordance with the stored positional information. In this method, however, burst defects are inspected by controlling the magnetic disk position for each individual drop-out (corresponding to 1 bit of data), resulting in a low inspection efficiency.

Moreover, defects on disc-shaped information recording media include physical defects and data defects, and the process required after defect detection depends on which of these two defect types is detected. Therefore it is necessary to identify the defect type and to store it in memory. However, the above two publications do not disclose any technologies which meet such a requirement.

The recording format for an optical disk will be described in the following, taking a 5.25-inch optical disk of ISO standards as an example.

A disc-shaped information recording medium 51 has recording tracks formed in a spiral or in concentric circles on its surface. As shown in FIG. 5, the tracks are grouped into PEP (Phase Encode Part) control tracks 51A, SFP (Standard Format Part) control tracks 51B, user area 51C and SFP control tracks 51D, each including a plurality of tracks, from the inside toward the outside. On each control track, data such as data signal recording and reproducing conditions regarding the disc-shaped information recording medium 51 is recorded. The user area 51C is used by the user to record any desired data.

All tracks of the disc-shaped information recording medium 51 except for the PEP control tracks 51A are divided into sectors. Each sector consists of a header section 50A where track and sector addresses are recorded, and a data recording section 50B where data is to be recorded. However, as described above, data regarding the disc-shaped information recording medium 51 is recorded in the data recording sections 50B of the SFP control tracks 51B and 51D, and user data is to be recorded in the data recording section 50B of the user area 51C. User area 51C remains blank at the time of the inspection at the factory. A flag section 50C is formed at the head of the data recording section 50B of the user area 51C.

For a disc-shaped information recording medium 51 having such a format, the type of defect and even the method of inspection vary depending on the section. For example, in the data recording section 50B of the user area 51C where no data has been recorded, no data defect can exist, and only physical defects may be detected. In contrast, both types of defect may occur in the header section 50A of the SFP user area 51C. For a data defect which requires a different inspection method, it is necessary also to identify the area in which the defect is located. For this purpose, in the prior art, inspection has been carried out twice for the user area; once for the header sections 50A of all tracks and again for the data recording sections 50B of all tracks, because the user area includes the header sections 50A and the data recording sections 50B alternating over the entire periphery. This method has a problem of low inspection efficiency.

SUMMARY OF THE INVENTION

The present invention is intended to solve such problems as described above. According to the invention, individually detected 1-bit defects are classified according to their positional information as a cluster of defects. The types of defects or defect clusters are identified and the type, position and size information of the defects and defect clusters is stored to enable the defect detection to be completed in a single inspection. Another purpose of the invention is to provide a defect inspection apparatus for disc-shaped information recording media which enables simple operation during microscopic inspection or the like after defect detection.

In order to achieve these purposes, the defect inspection apparatus of the invention comprises a means for detecting defects by using reproduced signal from a disc-shaped information recording medium, a means for detecting the type of detected defect, a means for detecting the position of the detected defect in the radial and circumferential directions, a means for grouping the defects into clusters by the detected positions, a means for calculating the dimensions of the defect cluster in the radial and circumferential directions, and a means for storing the information of the type, position and dimensions of the detected defect and defect clusters.

An information recording medium to be inspected is operated in a reproduction apparatus to obtain reproduction signals. Defects are detected by means of the reproduction signals, and the type and the radial and circumferential positions of the defect are detected at the same time. Then neighboring defects are grouped in a defect cluster in accordance to the positional information, and the radial and circumferential dimensions are calculated. Types, positions and dimensions of the defects and defect clusters are stored in memory and are used in the inspection by means of a microscope.

The above and further objects and features of the invention will more fully be apparent from the following detailed description with accompanying drawings.

BRIEF DESCRIPTION OF THE DRAWINGS

FIG. 15 is a table which shows the assignment of the size, kind data bits, FIG. 18 is a flow chart of a procedure for grouping the defects into clusters, FIGS. 23, 24 and 25 are examples of lists of defect data, FIG. 27 is a list showing the data corresponding to the burst defects shown in FIG. 26, and FIGS. 28, 29 and 30 are examples of lists of defect data.

DESCRIPTION OF PREFERRED EMBODIMENT

An embodiment of the invention for optical disks is explained with reference to the drawings.

Figure 1:
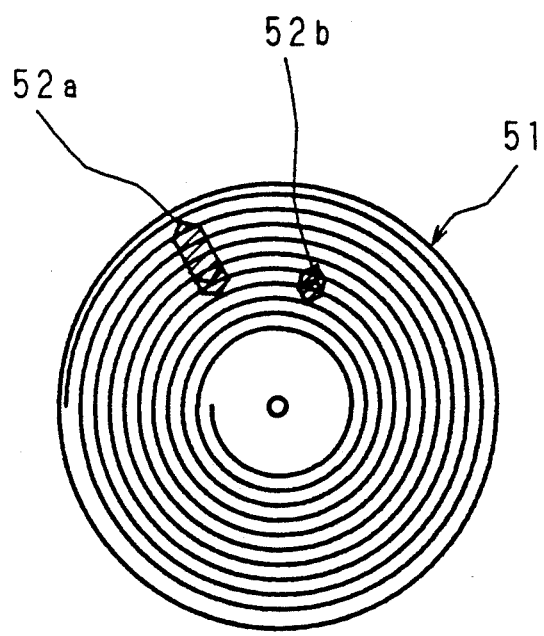
FIG. 1 is a schematic diagram showing a disc-shaped information recording medium having burst defects.
Figure 2:
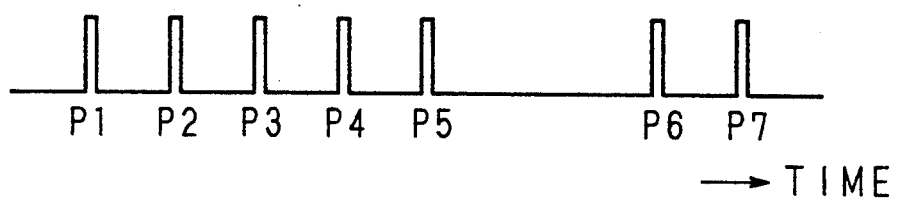
FIG. 2 is a waveform drawing showing drop-out pulses.
Figure 3:
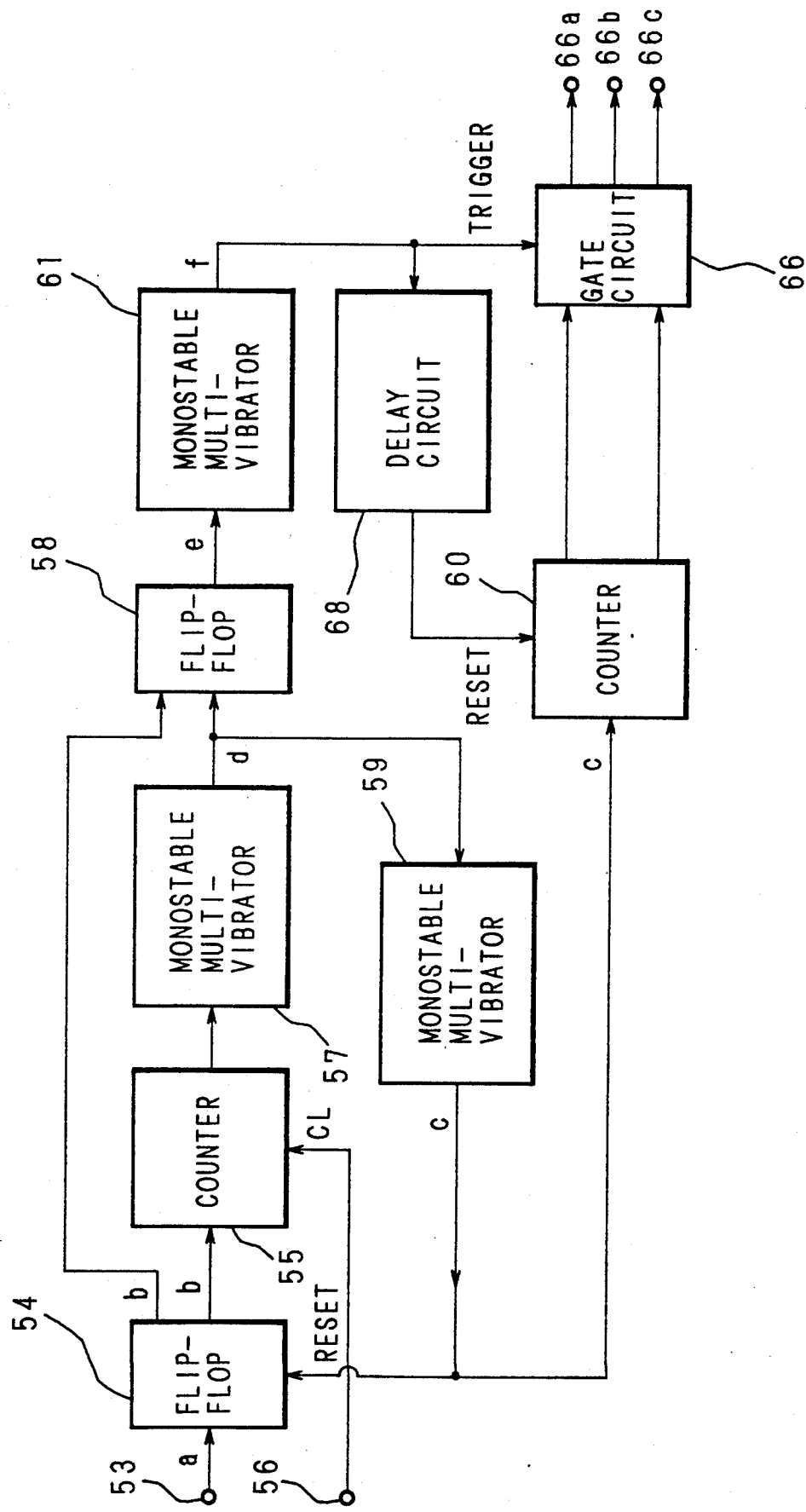
FIG. 3 is a block diagram showing a defect inspection apparatus of the prior art, FIG. 4, consisting of (A)–(F), is a timing chart which illustrates the operation of the apparatus shown in FIG. 3.
Figure 4:
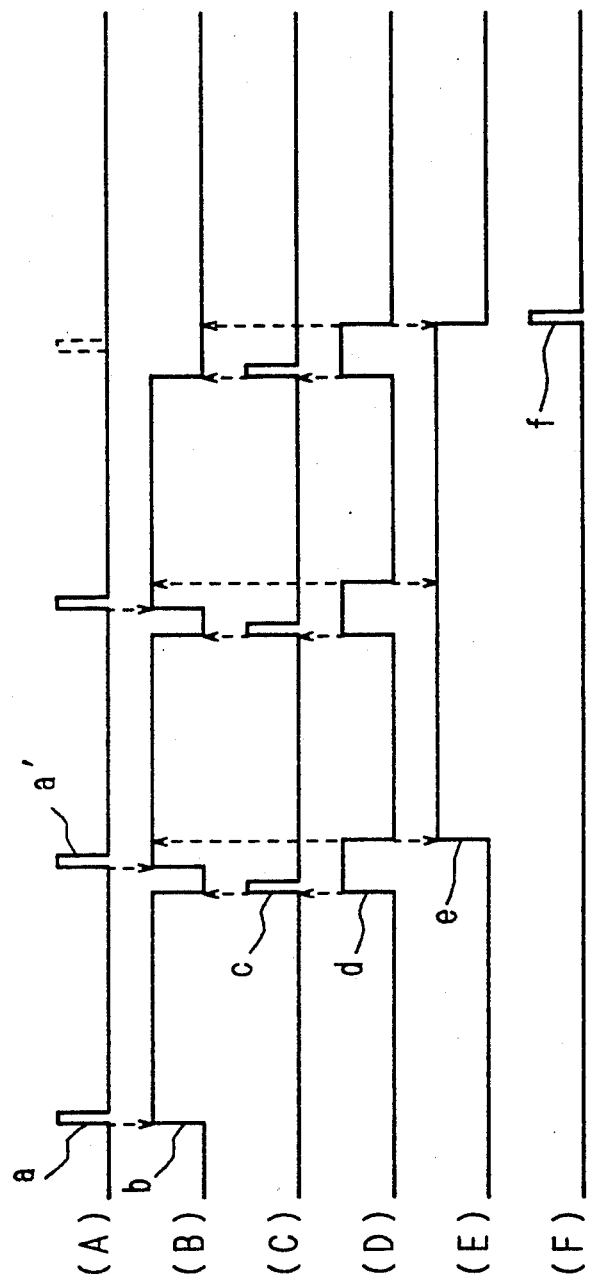
Figure 5:
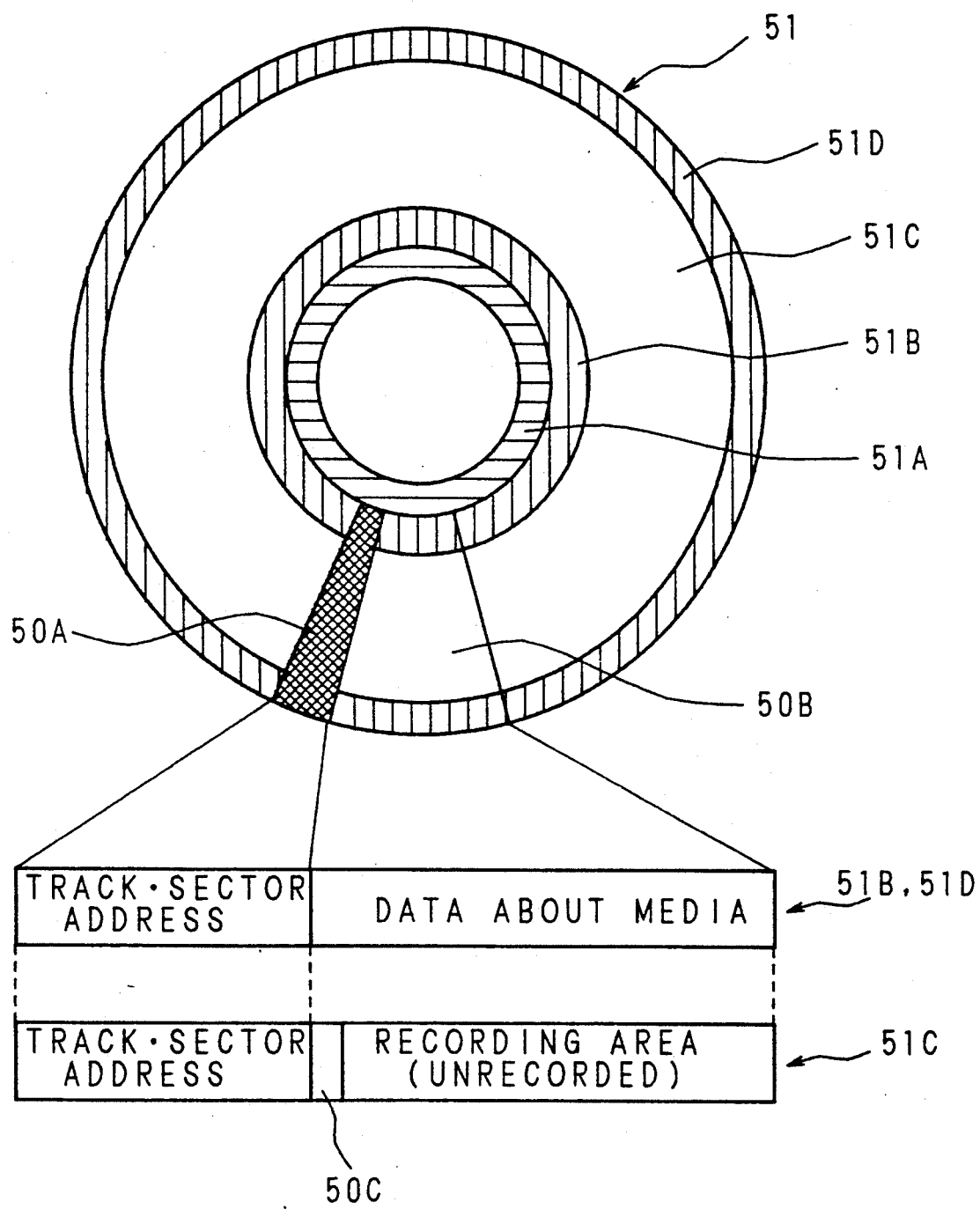
FIG. 5 shows the structure of the information recording area of an optical disk according to ISO standards.
Figure 6:
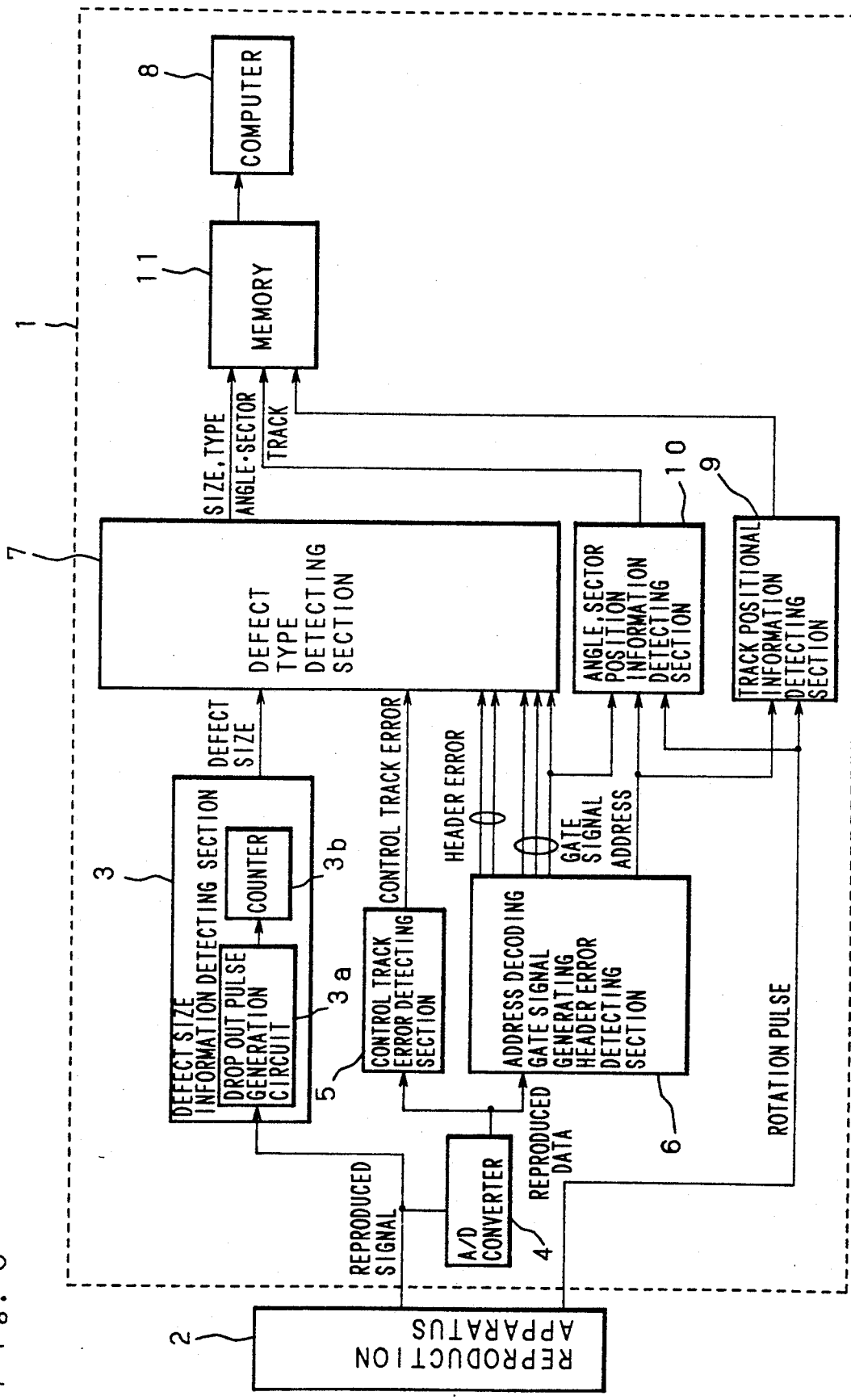
FIG. 6 is a block diagram which shows the apparatus of the present invention.

FIG. 6 is a block diagram showing the overall constitution of the apparatus 1 of the invention (enclosed by dashed lines). An optical disk to be inspected (not shown) is mounted in a reproduction apparatus (optical disk drive) 2, and the reproduction signals obtained therefrom are fed to a defect size information detecting section 3 and an A/D (analog to digital) converter 4. The defect size information detecting section 3 detects the defect size and sends it to a defect type detecting section 7. The A/D converter 4 converts the input analog signals to digital signals and sends the reproduced data to a control track error detecting section 5 and an address decoding-gate signal generating-header error detecting section 6. The control track error detecting section 5 detects errors included in the control track data which is recorded in data recording sections 50B of the SFP control track 51B and 51D, and sends the result to the defect type detecting section 7.

The address decoding-gate signal generating-header error detecting section 6 decodes the address signals included in the reproduced data from the header sections 50A of the SFP control tracks 51B and 51D and the user area 51C to identify the area on the track and sends the result to a track positional information detecting section 9 and an angle, sector position information detecting section 10. The address decoding-gate signal generating-header error detecting section 6 also generates gate signals corresponding to the information recording area currently being reproduced and sends the gate signals to the defect type detecting section 7 and the angle, sector position information detecting section 10. The address decoding-gate signal generating-header error detecting section 6 also detects the errors (header errors) included in the data which is recorded in the header sections 50A of the tracks, and sends the result of the detection to the defect type detecting section 7.

The defect type detecting section 7 detects information related to the type of the defects from the results of defect detection and the gate signals obtained from the defect size information detecting section 3, control track error detecting section 5 and the address decoding-gate signal generating-header error detecting section 6. The result is stored in a memory 11.

The reproduction apparatus 2 sends an output of one rotation pulse to the angle, sector position information detecting section 10 and the track positional information detecting section 9 for every rotation of the optical disk. The track positional information detecting section 9 detects information regarding the tracks which include defects or errors from the rotation pulse and the result of address decoding obtained from the address decoding-gate signal generating-header error detecting section 6, and the information is stored in memory 11.

The angle, sector position information detecting section 10 detects the angle of the defect or error position from a reference position or the sector information, from the rotation pulse and the result of address decoding obtained from the address decoding-gate signal generating-header error detecting section 6, and the information is stored in memory 11.

The memory 11 stores the results of the detection by the detect type detecting section 7, the track positional information detecting section 9 and the angle, sector position information detecting section 10, as described above.

A computer 8 reads the defect and error data stored in the memory 11 and detects defect clusters as described below. The computer 8 also outputs the position information of an X-Y stage (not shown) for the inspection of the optical disk by means of a microscope (not shown).

The defect size information detecting section 3, the A/D converter 4, the control track error detecting section 5, the address decoding-gate signal generating-header error detecting section 6, the defect type detecting section 7, the track positional information detecting section 9, the angle, sector position information detecting section 10, the memory 11 and the computer 8 constitute the defect inspection apparatus 1 of the invention. Each component unit is described in detail in the following.

Figure 7:
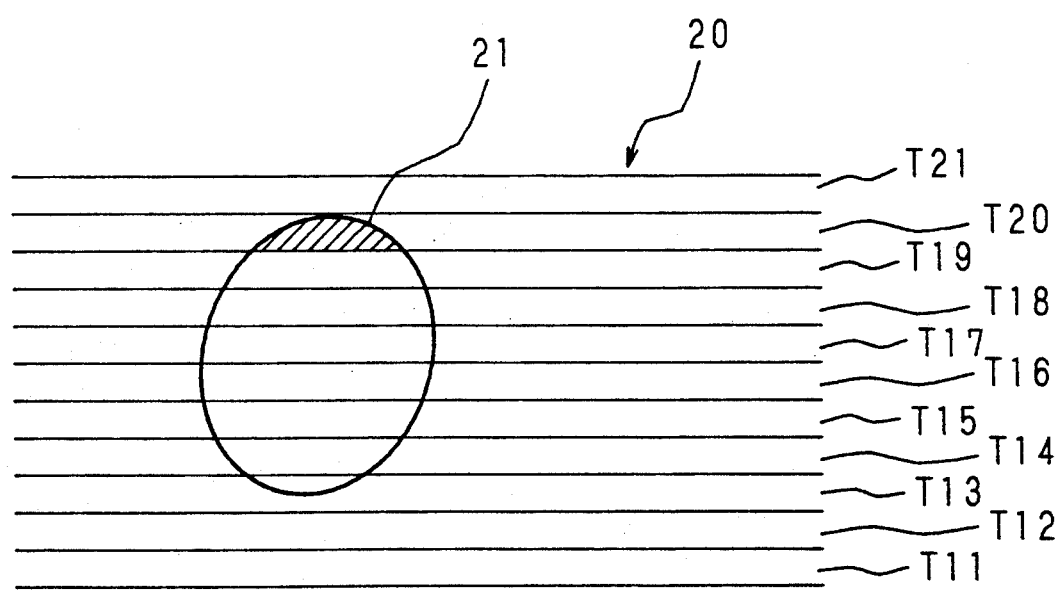
FIG. 7 is a schematic drawing of burst defects.

First the defect size information detecting part 3 is described. FIG. 7 is an enlarged schematic drawing of burst defects on a disc-shaped information recording medium. Disk 20 is shown in FIG. 7 with its rotation center facing downward and its periphery upward. The disk 20 has a multitude of tracks T formed on the surface, of which an 11th track T11 through a 21st track T21 are shown as an example in FIG. 7.

A burst defect 21 involves the tracks from the 13th track T13 to the 20th track T20 of the disk 20 in this example. Therefore, the number of tracks crossed by the burst defect 21 is eight, and the center track of the burst defect 21 is the 17track T17.

When the reproduction apparatus 2 reproduces the signals from the 20track T20, for example, then length information of the defect in the circumferential direction, which is hatched in the drawing, is obtained from the defect size information detecting section 3. The defect size information detecting section 3 has a drop-out pulse generator circuit 3a which detects the signals due to the defect included in the reproduced signal, and a counter 3b which counts the length of each drop-out pulse as a number of clock pulses.

The counter 3b sends circumferential length of the defect to bits 0, 1, 2—A, B of a selector 7a (FIG. 8) of the defect type detecting section 7 as 11 bits binary number.

Figure 9:
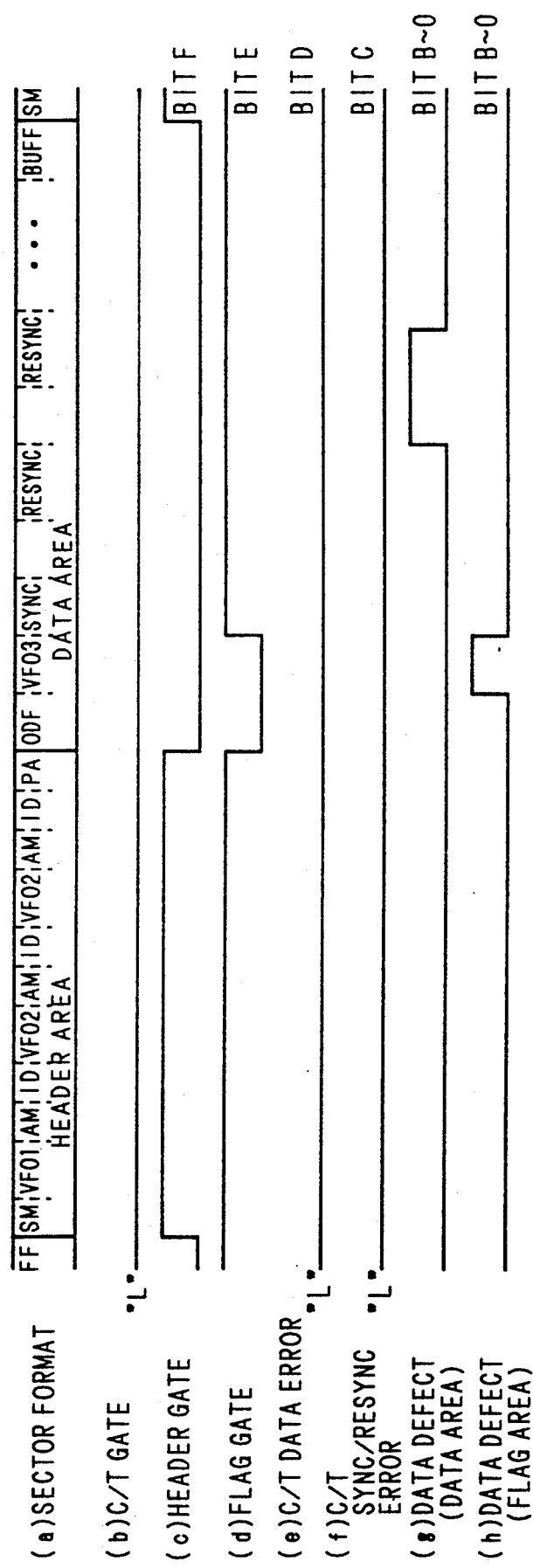

FIG. 9 shows the data format (a) of one sector of the user area 51C, gate signals and error signals (b)-(h). The gate signal generating section 6d (FIG. 13) of the address decoding-gate signal generating-header error detecting part 6 generates various gate signals upon this format.

FIG. 9(b) is the gate signal of the SFP control tracks 51B, 51D which is at a low level during reproduction of the user area 51C. The control track gate signal is sent to the selectors 7a, 7b, 7c of the defect type detecting section 7 shown in FIG. 8. The header gate shown in FIG. 9(c) remains at a high level during the reproduction of the header area, and this signal is sent to bit F of the defect type detecting section 7. The flag gate shown in FIG. 9(d) is at a low level only at the flag area (ODF and VFO3), of the data area. The flag gate signal is fed to the defect type detecting section 7 as bit E. FIGS. 9(e) and (f) show the presence or absence of data errors in the SFP control track and of SYNC, RESYNC errors in the SFP control track; these signals remain at a low level when errors do not exist, as shown in FIGS. 9(e) and 9(f). The control track data error and control track SYNC, RSYNC error signals are provided as outputs from the SFP control track error detecting section 5 and are fed to bits C and D of the defect type detecting section 7.

When the data area of the user area 51C includes a defect, pulses are generated as shown in FIG. 9(g) in the defect size signals 0, 1, 2, ... A, B. When the flag area includes a defect, pulses are generated as shown in FIG. 9(h) in the defect size signals 0, 1, 2, ... A, B. Size information regarding these defects is fed to bits 0-B of the defect type detecting section 7.

Figure 10:
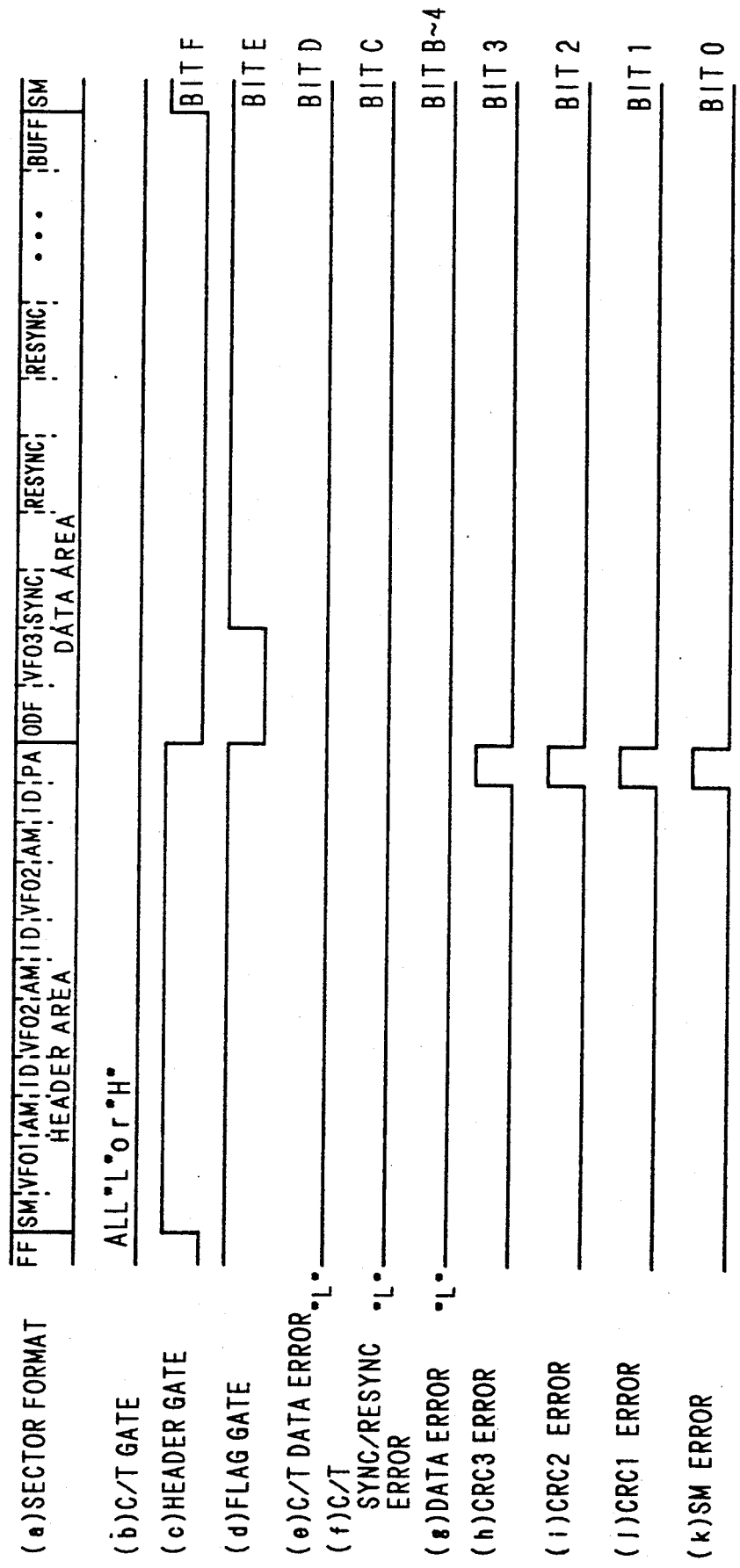

FIG. 10 shows other error occurrence conditions in the header area. When a CRC (Cyclic Redundancy Check) error signal is obtained in the header area, pulses which represent CRC1, CRC2, CRC3 or SM error are obtained and are fed to bits 3, 2, 1, 0 of the defect type detecting section 7, respectively. Errors in the header area are processed by the header error detecting part of the address decoding-gate signal generating-header error detecting section 6.

Figure 11:
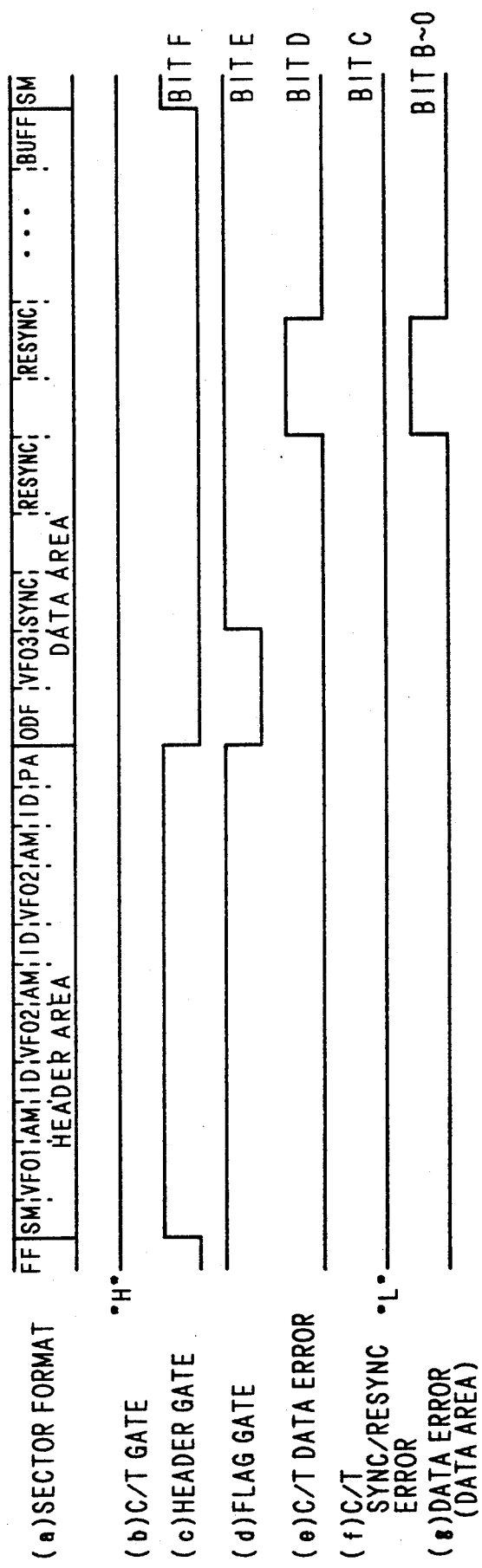

FIG. 11 is a timing chart in a case where the SFP control track includes a data error. The control track gate signal is at a high level as shown in FIG. 11(b). If the SFP control track 51B or 51D includes an error, the control track error detecting section 5 detects it and provides an output signal as shown in FIGS. 11(e) and 11(g) to bit D and bits 0-B of the defect type detecting section 7.

Figure 12:
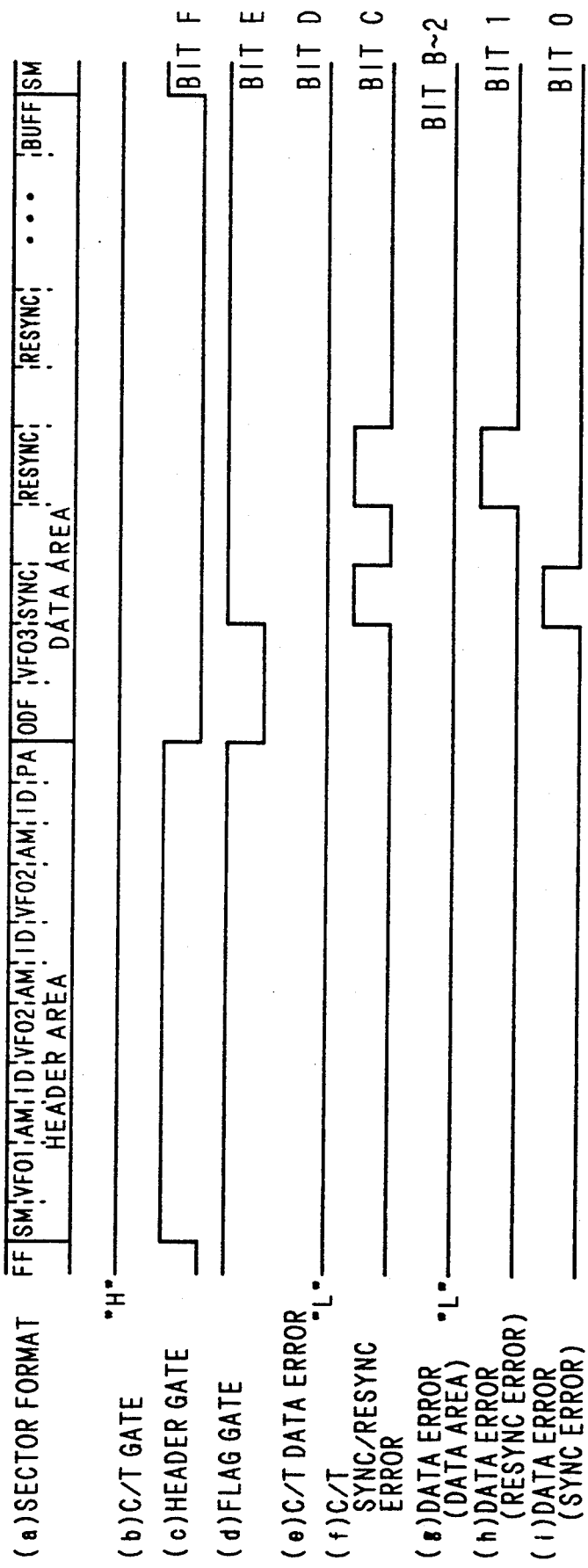

FIG. 12 shows a timing chart in a case where the control track includes SYNC, RESYNC errors. In this case, the situation is the same as that shown in FIG. 11 except for a high level signal appearing in the SYNC area and/or RESYNC area.

Figure 8:
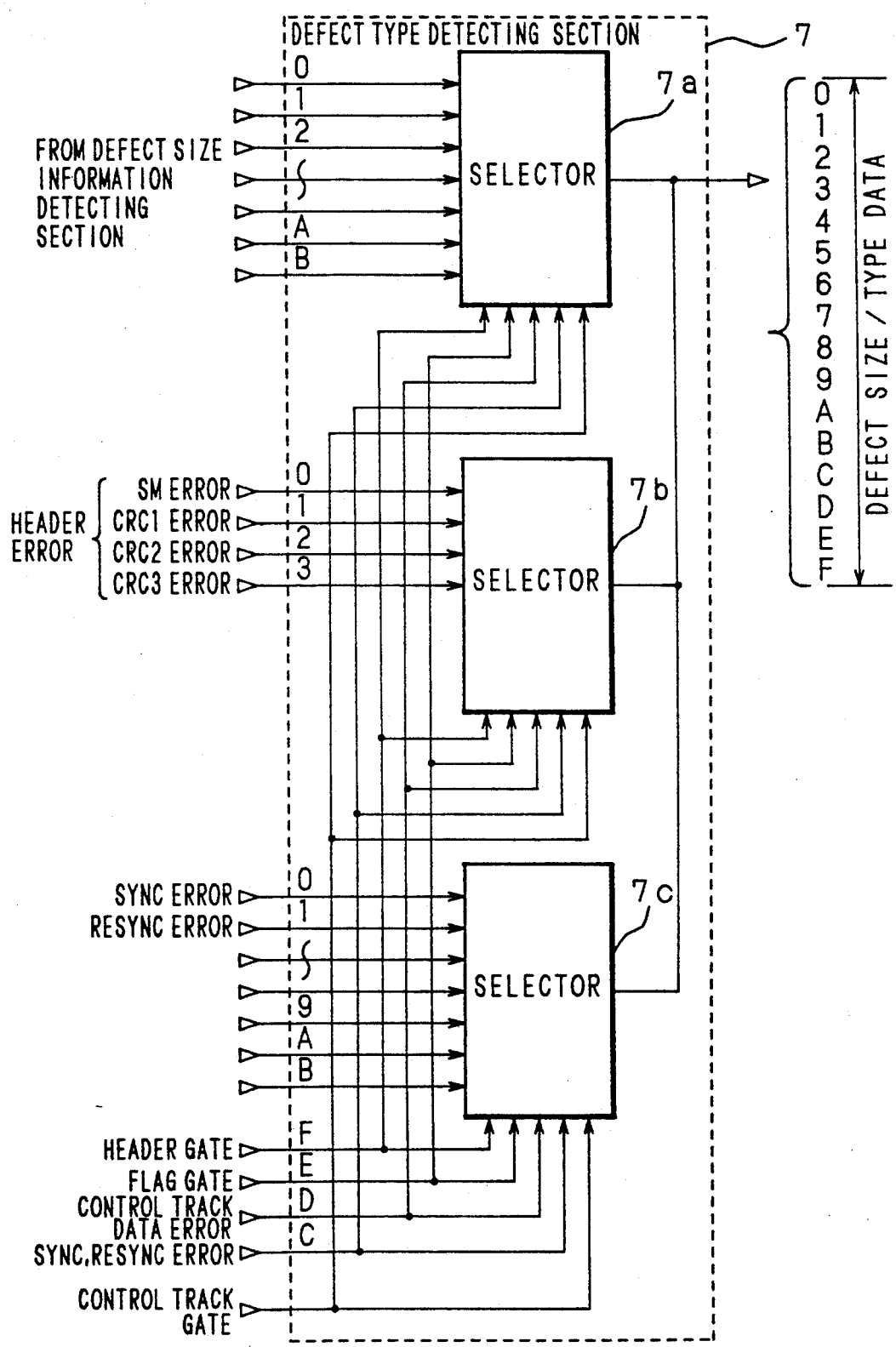
FIG. 8 is a block diagram of a major part of the defect type detecting section, FIGS. 9, 10, consisting of (a)–(k), 11, and 12, consisting of (a)–(i), are timing charts of the gate signals in the apparatus of FIG. 6.
Figure 13:
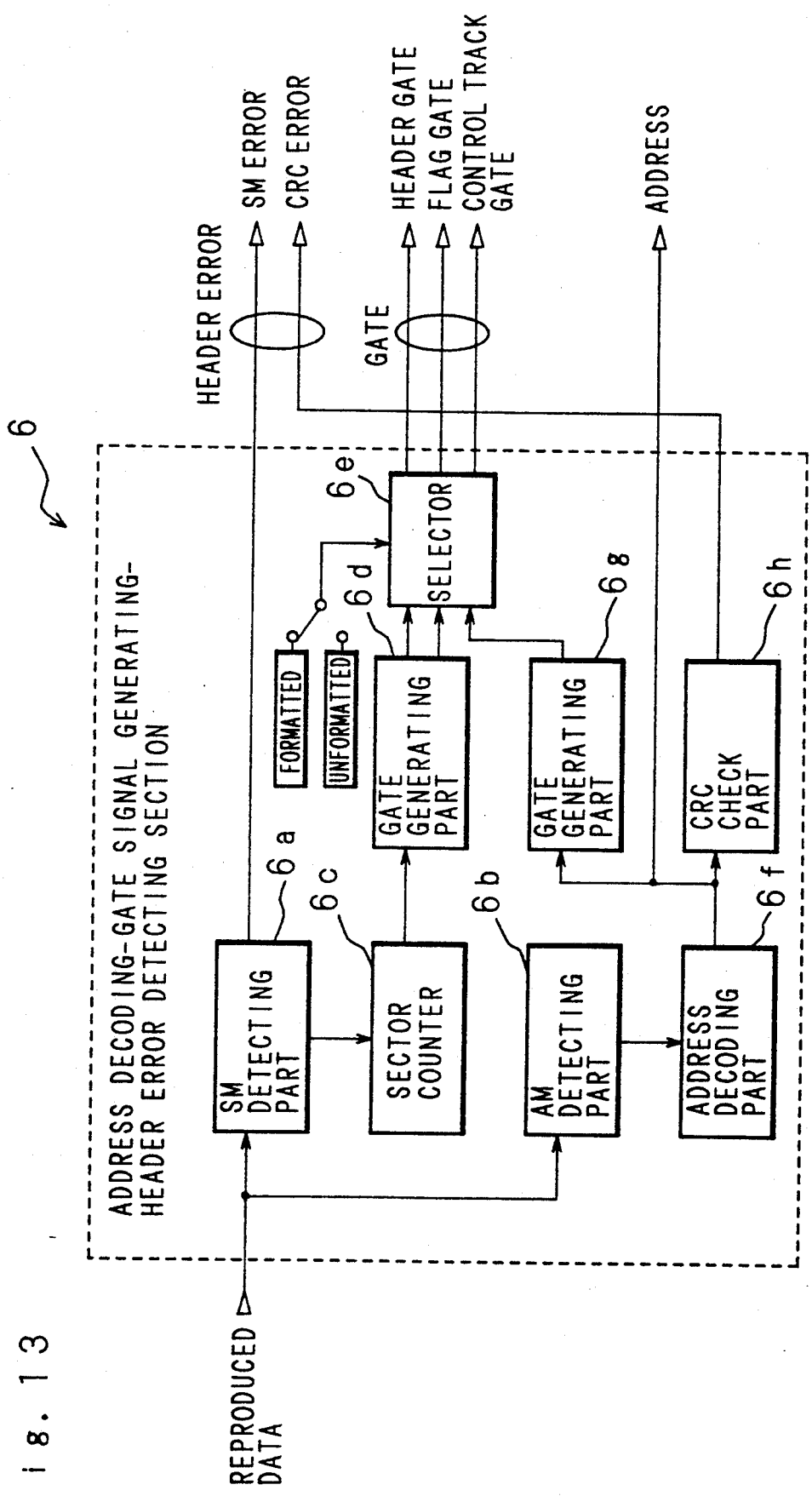
FIG. 13 is a block diagram of an address decoding-gate signal generating-header error detecting section, FIG. 14, consisting of (a)–(e), shows the format of the defect size/type data.

FIG. 13 is a block diagram illustrative of the structure of the address decoding-gate signal generating-header error detecting section 6. Digital reproduced data from the the A/D converter 4 is fed to a sector mark (SM) detecting part 6a and an address mark (AM) detecting part 6b of the gate signal generating section. The sector mark detecting part 6a detects the sector mark in the header area of the user area 51C, SFP control areas 51B and 51D. If no sector mark is obtained or an abnormal sector mark is obtained, an SM error signal is generated to be fed to bit 0 of the selector 76 as shown in FIGS. 8 and 10. When the SM detecting part 6a detects the sector mark SM, it resets a sector counter 6c, and the sector counter 6c starts a clock. The count value is fed to a gate generating part 6d which provides an output of the header gate signal or the flag gate signal depending on the count value. The output gate signal is fed to a selector 6e.

The address mark from the address mark detecting part 6b is fed to an address decoding part 6f where address data is obtained. The address data is fed to the track position information detecting section 9 and the angle sector position information detecting section 10. The address is checked in a CRC check part 6h. If the check indicates the presence of an error, a CRC error signal (CRC1, 2, 3) is sent to the defect type detecting section 7. A gate signal generating part 6g checks the address to see whether the error is in the control tracks 51B, 51D or in the user area 51C. If the former is the case, a control track gate signal of a high level is fed to the defect type detecting section 7 via a selector 6e. The selector 6e receives a signal indicating whether the optical disk under inspection is formatted or not, whereby the header gate signal, the flag gate signal or the control track gate signal is selectively outputted.

The defect type detecting section 7 provides an output of 16-bit defect size/type data in accordance with the inputs from the defect size detecting section 3, the control track data error detecting section 5 and the address decoding-gate signal generating-header error detecting section 6. The 16-bit data is stored in the memory 11 together with 16-bit data representing the angle and sector sent from the angle, sector position information detecting section 10 and 16-bit data representing the track sent from the track positional information detecting section 9.

FIG. 14 shows an example of the stored data. FIG. 14(a) shows an example of a defect in an unformatted disk or a defect in the user area 51C. As described above, defect size data is stored in the twelve bits 0, 1, 2, ... A, B on the LSB side, while four bits on the MSB side C, D, E and F are all zero.

Figure 14A:
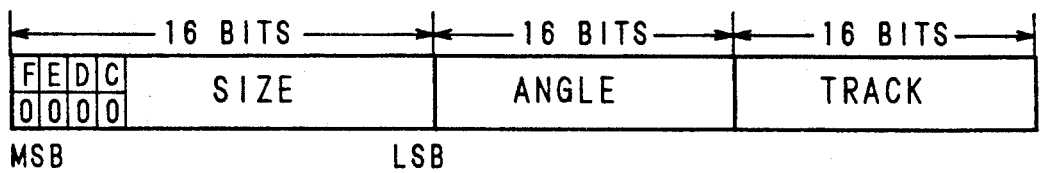
Figure 14B:
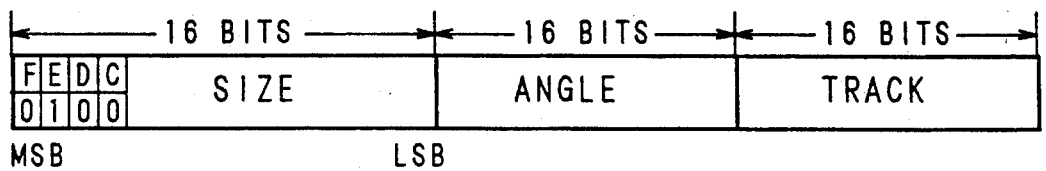

FIG. 14(b) shows the data in a case where the SFP flag area of a formatted disk includes a defect. The 4-bit data on the MSB side is "0100" because the flag gate signal (bit E) for this defect is a high level.

Figure 14C:
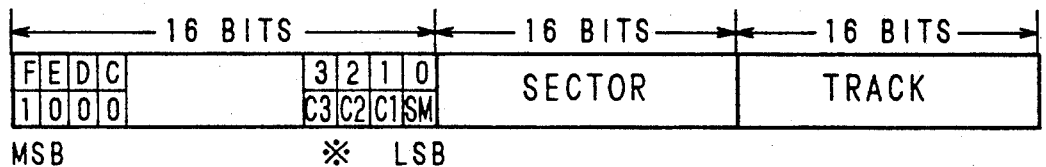

FIG. 14(c) shows a case where an SFP header error exists. The 4-bit data on the MSB side is "1000", and the bits 0, 1, 2 and 3 of the LSB side are 1 to indicate an SM error, CRC1, 2, 3 error, respectively. The intermediate eight bits of the size data are irrelevant for this error, and the second 16 bits indicate sector rather than angle.

Figure 14D:
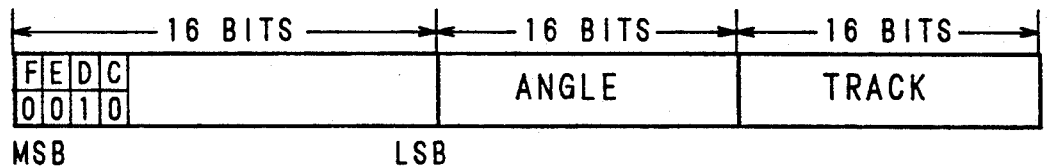
Figure 14E:
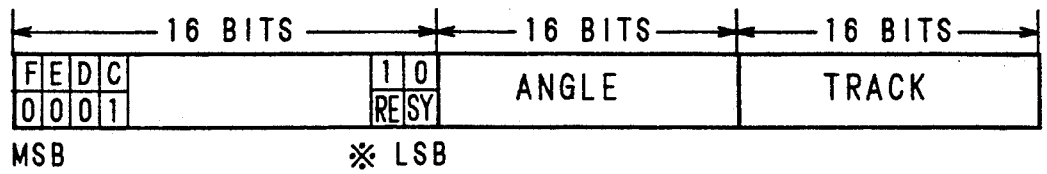

FIG. 14(d) shows a control track data error in which case four bits on the MSB side are "0010". FIG. 14(e) shows SYNC and RESYNC errors. The 4 bits on the MSB side become "0001", and a SYNC or RESYNC error is distinguished by two bits on the LSB side. In these cases, the intermediate ten bits of the size data is irrelevant.

FIG. 15 is a table that shows the four bits F, E, D, C on the MSB side and bits 3, 2, 1, 0 on the LSB side and the corresponding types of defects.

Figure 16:
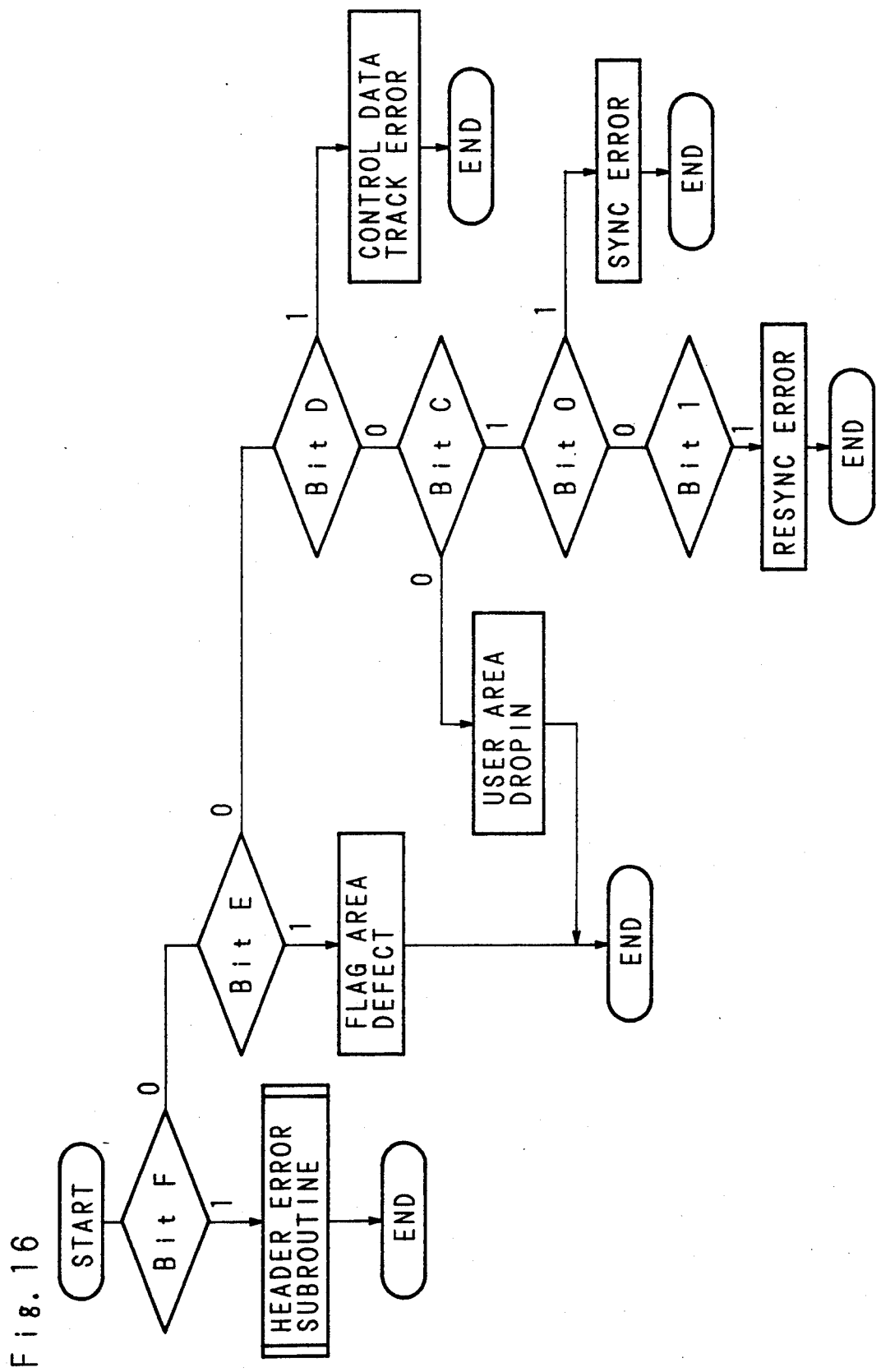
FIGS. 16 and 17 are flow charts of a defect type identification process.
Figure 17:
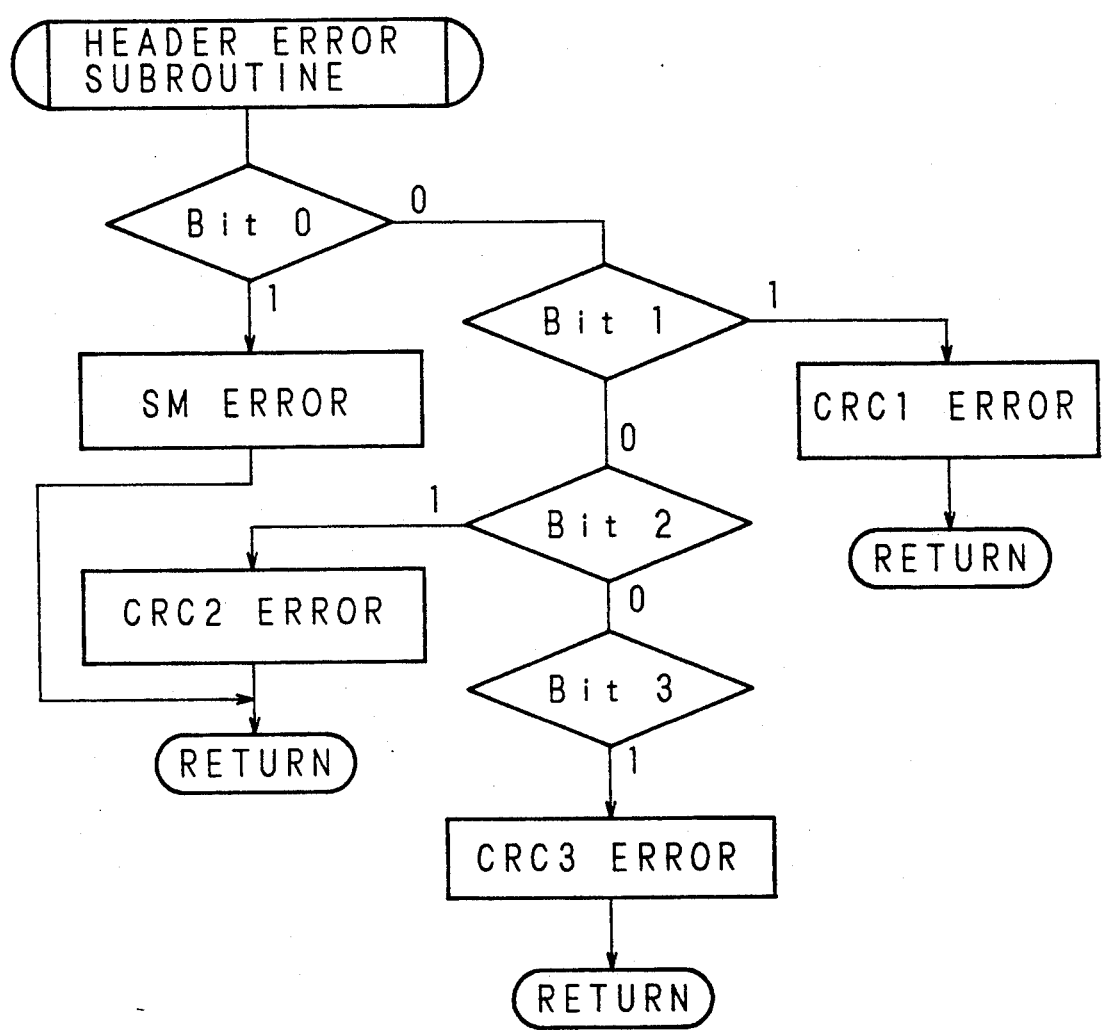

Data processing by the computer 8 is explained below. FIGS. 16 and 17 are flow charts which indicate the procedure for identifying the defect type when the defect size/type data is stored in the memory 11 as described above.

First, the computer 8 reads the defect data and checks the size data starting with the MSB side as shown in FIG. 16. If bit F is "1", the process proceeds to the header error subroutine (FIG. 17). If bit F is "0" and bit E is "1", a flag area defect is assumed. If bit E is "0" and bit D is "1", a control track data error is assumed. If bit D is "0" and bit C is "0", a user area defect or unformatted disk is assumed. If bit C is "1" and bit 0 is "1", a SYNC error is assumed. If bit 0 is "0" and bit 1 is "1", a RESYNC error is assumed.

In the header error subroutine, an SM error is assumed if bit 0 is "1", a CRC1 error is assumed if bit 0 is "0" and bit 1 is "1", a CRC2 error is assumed if bit 1 is "0" and bit 2 is "1", and a CRC3 error is assumed if bit 2 is "0" and bit 3 is "1".

The computer 8 identifies the type of defect from the defect data as described above.

A procedure for classifying or grouping the defects into defect clusters is described in the following. FIG.

18 shows a flow chart of the main routine, and FIGS. 19 through 22 show flow charts of the subroutines.

The memory 11 stores the defect size and type data as described above. FIG. 23 shows an example of the stored information, indicating the size, track No. and angle. The No. is a serial number of the defect, CLASS is a classification of size in three levels, S, M or L (all M in this example), and R is the distance of the track from the disc center. The computer 8 reads the data and sorts the defect data in a descending order of the track Nos. Then the computer 8 initializes a parameter I to 1 (steps S1, S2). The parameter I is a number assigned to the sorted defect data. FIG. 24 shows the data list after sorting.

Assume that [I] is the track No. which includes the Ith defect data. When [I+1]−[I] is 0, other defect data exists on the same track. If the value of [I+1]−[I] is −1, the presence of defect data on the adjacent track is indicated. A value of −2 or lower indicates that defect data exists on discontinuous tracks, namely two defects exist on tracks which are separated by at least one track. Therefore [I+1]−[I] is calculated in step S3 to classify the defects (steps S3, S4, S5, S6).

The computer 8 counts the number of times that the result of the step S3 is 0 or −1 (steps S7, S8). When the result is −2 or below, because continuous defects have been detected in steps S5 and S8 in advance, the central track No. of continuous tracks including defects is stored in the memory (step S9).

When I=1 in FIG. 24, [I+1]−[I] becomes 17133−18411≦−2, and the defect on the track [I]=18411 is regarded as a defect on a discontinuous track.

When I=2, because 17132−17133=−1, the defects are regarded as defects on continuous tracks. This condition continues till I=20.

When I=21, because 11954−17114≦−2, the 22nd defect is regarded as a defect on a track which is discontinuous from the previous ones, and the 2nd through 21st defects are regarded as a cluster of defects. In step S9, track at the center of the 2nd to 21st defects is obtained as the track at the 11th or 12th defect and is stored in the memory.

Similarly, the 22nd and 23rd defects are also regarded as a cluster of defects.

In this example, defects which correspond to [I+1]−[I]=0 (two or more spaced-apart defects on the same track) do not exist.

The computer 8 performs the above process for all defect data while incrementing the parameter I by 1 (steps S10, S11).

Figure 19:
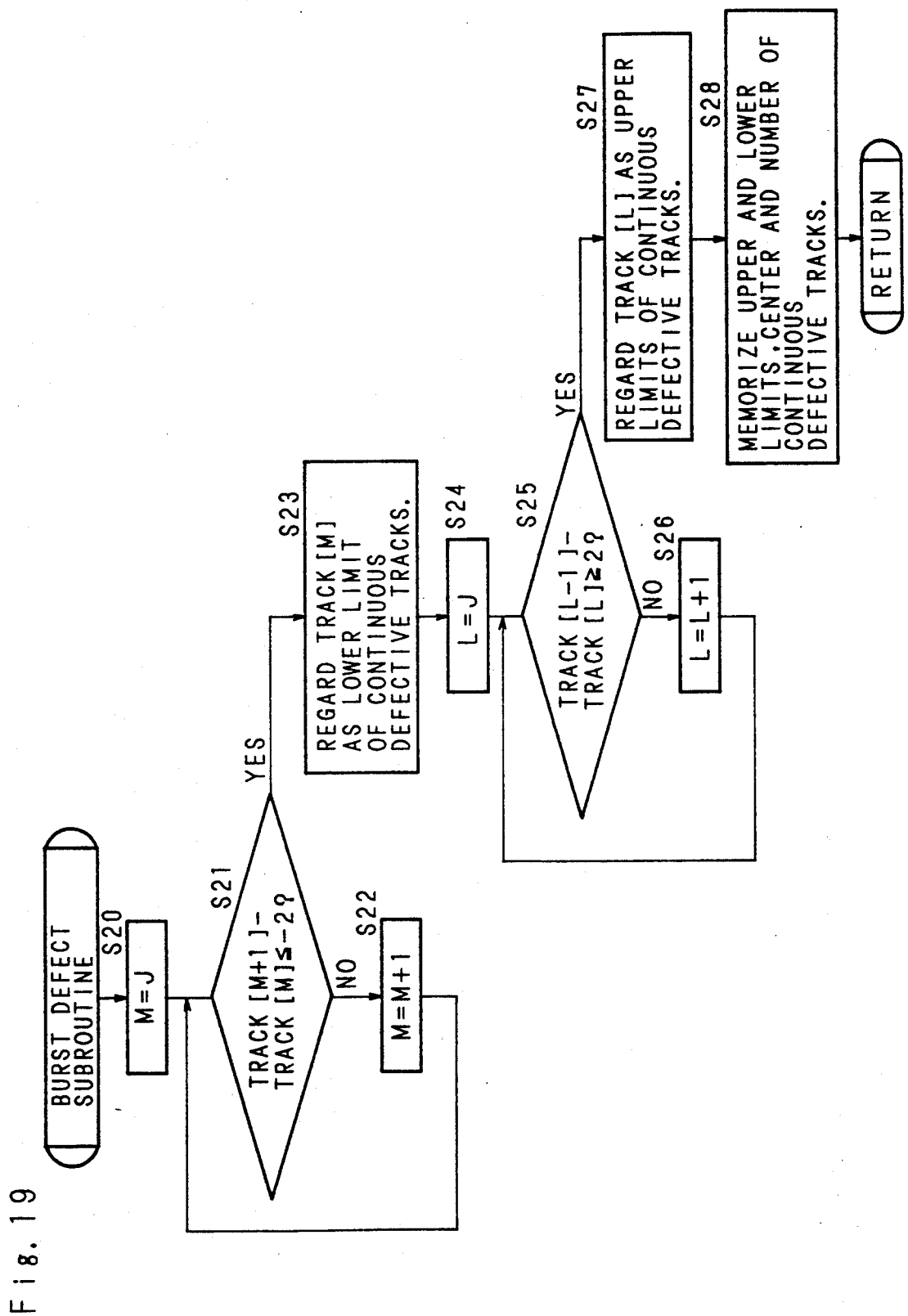
FIG. 19 is a flow chart of a burst defect subroutine.

Then the computer 8 initializes a parameter J to 1 (step S12) and determines in step S13 whether the track J (Jth track) is the center of a cluster of continuous defects by means of the data stored in step S9 described above. The process proceeds to step 15 after the burst defect subroutine (step S14) shown in FIG. 19 is executed if the result is yes, or directly to step S15 if the result is NO.

The burst defect subroutine, which is described in detail below, is shown in the flow chart of FIG. 19. Its purpose is to defect the upper and lower limits of the continuous defective tracks which indicate the extent of the continuous tracks which contain defective data, the central track and the number of continuous tracks which contain defective data. The computer 8 executes this process while incrementing the parameter J by 1 (step S16) and, upon completion, executes a defect separation subroutine (step S17).

The defect separation subroutine, described in detail below, is indicated by the flow chart in FIG. 20. Its purpose is to separate defects on the same track by the angle along the periphery of the disc-shaped information recording medium. In other words, when a plurality of defects exist on the same track, the defect separation subroutine determines whether the defects constitute a burst defect or are separated defects, in accordance with the angular positions of the defects from a reference position on the disc-shaped information recording medium.

Upon completion of the defect separation subroutine of step S17, the computer 8 sends the result to a CRT display or a printer (step S18).

FIG. 19 is a detailed flow chart of the burst defect subroutine.

First the computer 8 initializes a parameter M to J (step 20), and increments the parameter M by 1 until [M+1]−[M] becomes less than or equal to −2 (step S22). When the value of [M+1]−[M] becomes less than or equal to −2 (step S21), the track No. [M] is regarded as the lower end, that is the innermost track, of the continuous defective tracks (step 23).

In this process, track Nos. are checked successively starting with the center of the continuous defect, namely the defect cluster. When the track Nos. are separated by 2 or more, the current track [M] is determined to be the lower end of the defect cluster. In the example of the cluster of defects No. 2 through No. 21 in FIG. 24, if M=J=12 is assumed to be the center, M is incremented sequentially from [13]−[12]=17122−17123. When [22]−[21]=11954−17114≦−2 is obtained, the track corresponding to M=21 is determined to be the innermost track of the defect cluster.

Similarly, the computer 8 initializes a parameter L to J (step 24), and increments the parameter L by 1 until [L−1]−[L] becomes equal to or greater than 2 (step S26). When the value of [L−1]−[L] becomes equal to or greater than 2 (step S25), the track No. [L] is regarded as the upper end, that is the outermost track, of the continuous defective tracks (step 27).

Last, the computer 8 stores the upper and lower limits of the continuous defective tracks and the center track, and calculates the number of continuous tracks by using the upper and lower limits and stores the number of continuous tracks in the memory (step S28).

In the example of defects No. 2 through No. 21 in FIG. 24, calculation is performed sequentially from L=12. When [1]−[2]=18411−17133≦2 is obtained at L=2, the track corresponding to L=2 is regarded as the outermost track of the defect cluster.

Figure 20:
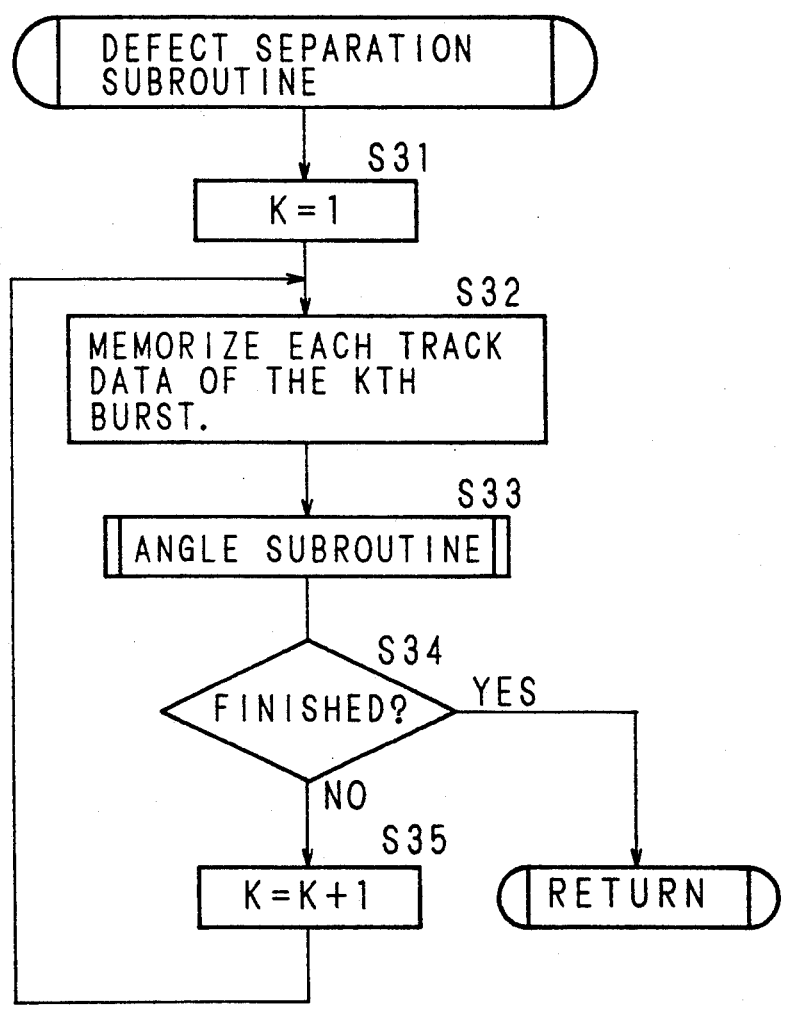
FIG. 20 is a flow chart of a defect separation subroutine.

FIG. 20 is a flow chart of the defect separation subroutine. In this subroutine, the computer 8 initializes a parameter K to 1 (step S31) and stores the data of each track of the 1st burst defect (defect cluster) (step S32) and executes an angle subroutine (step S33).

The angle subroutine, described in detail below, is indicated by the flowchart shown in FIG. 21. Its purpose is to determine whether a plurality of defects on a same track constitute a burst defect or are separate defects.

After it is determined by the angle subroutine of step S33 whether a plurality of defects on the same track constitute a burst defect or are separate defects, the computer 8 increments the parameter K by 1 and executes the above-mentioned process for each burst defect (step S35).

Figure 21:
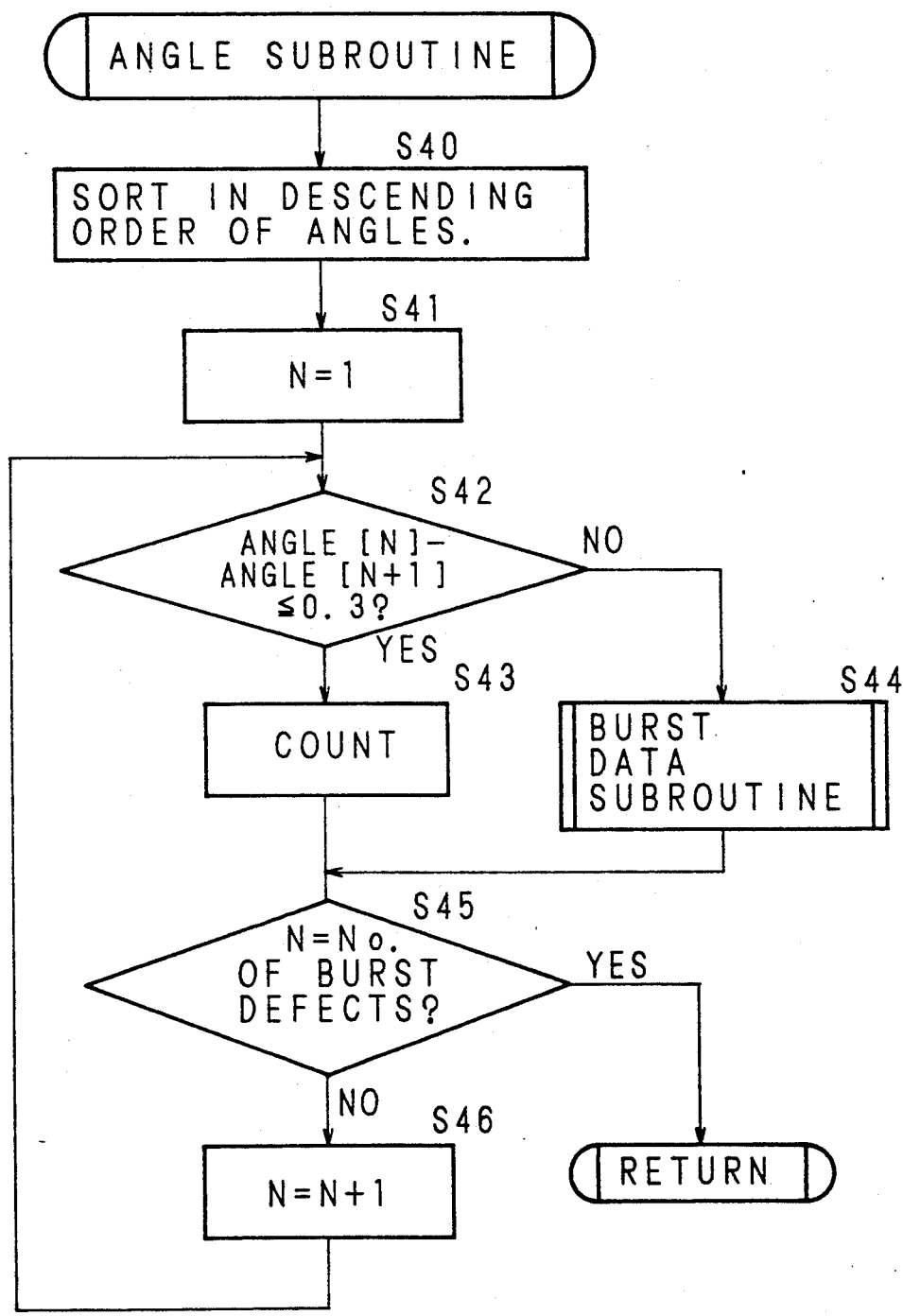
FIG. 21 is a flow chart of an angle subroutine.

FIG. 21 is a flow chart of the angle subroutine. The computer 8 sorts the defects of the same defect cluster, namely the Kth burst defect in descending order of angles (step S40). FIG. 25 shows the result of sorting in the descending order of angles.

Then a parameter N is initialized to 1 (step S41). For the angle [N] corresponding to each defect No. N in the Kth burst defect which is the subject of step S32 of the defect separation subroutine, while $[N]-[N+1] \leqq 0.3°$, the number of defects is counted (steps S42, S43). While $[N]-[N+1] \leqq 0.3°$, the defects No. N and No. N+1 are regarded as being continuous along the periphery of the disc-shaped information recording medium. If $[N]-[N+1]$ becomes greater than 0.3°, defects No. N and No. N+1 are regarded as separate defects, and the burst data subroutine (step S44) is executed. In the case of FIG. 25, it never happens that more than two defect clusters exist in the circumferential direction.

The computer 8 executes the above process until the parameter N reaches the number of burst defects while incrementing the parameter N by 1 (step S45, S46) and returns when the parameter N reaches the number of burst defects.

Figure 22:
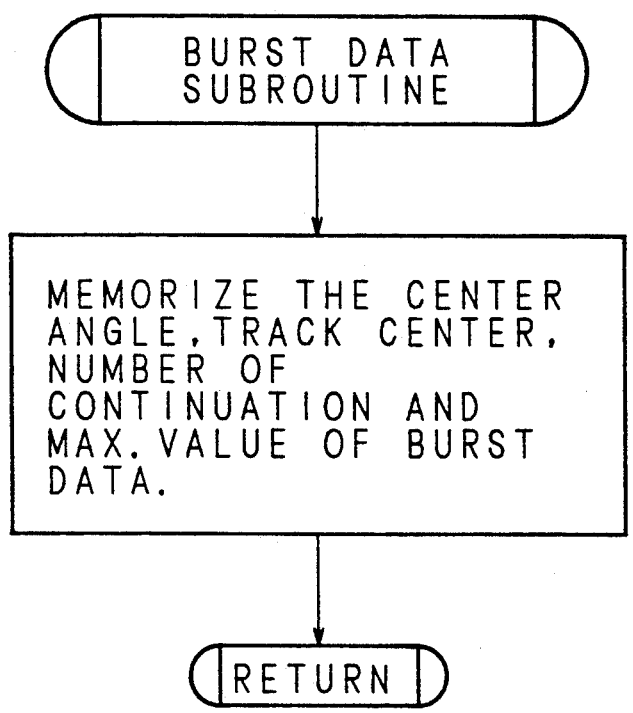
FIG. 22 is a flow chart of a burst data subroutine.

FIG. 22 is a flowchart of the burst data subroutine. In this subroutine, the computer 8 stores the angular center, the center track, the number of continuous tracks and the maximum width and returns. The angular center and the width are calculated based on the count in step S43.

By the above process, the computer 8 detects burst defects based on the data stored in the memory 11.

Figure 26:
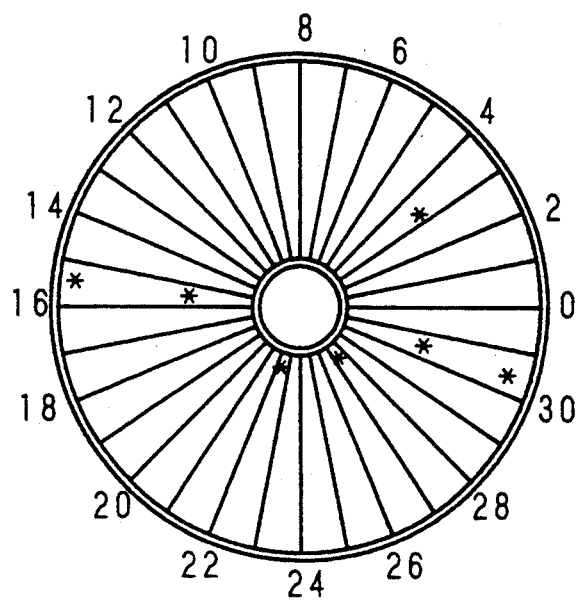
FIG. 26 is a schematic drawing showing an example of the inspection result.

FIG. 26 shows a result of burst defect inspection by means of the inspection apparatus of the invention in the form of a schematic diagram illustrative of a disc-shaped information recording medium (optical disk) to be inspected and burst defects existing on the information recording surface. FIG. 22 is a list of burst defects which were finally obtained.

A mark * in FIG. 26 shows a burst defect and a numeral indicates a sector No. SIZE (max) in FIG. 27 indicates the maximum width of a burst defect, and TRACK (center) indicates the center track No. of the burst defect. TRACK (cross) indicates the number of tracks which are covered by the burst defect. ANGLE (center) indicates the center angle of the burst defect. R indicates the distance of the burst defect from the center of the disc.

FIGS. 28, 29 and 30 show another example of the detected defects list. The list of FIG. 28 is the sorted result in a descending order of the size and the list of FIG. 29 is the sorted result in a descending order of the track number. In this example, defects on a track are found. The defects are classified into two cluster defects according to the angle informations as shown in FIG. 30.

In accordance with the method of the invention, inspection of defects is performed in a single reproduction. It is also made possible to group multiple defects in a defect cluster. Moreover, because the size and position of the defect cluster are stored in memory, the subsequent inspection by means of a microscope or the like is carried out efficiently.

As this invention may be embodied in several forms without departing from the spirit or essential characteristics thereof, the present embodiment is therefore illustrative and not restrictive, since the scope of the invention is defined by the appended claims rather than by the description preceding them, and all modifications that fall within the metes and bounds of the claims, or equivalents of such metes and bounds thereof are therefore intended to be embraced by the claims.

What is claimed is:

1. A defect inspection apparatus for disc-shaped information recording media, comprising:
    means for detecting defects by using a reproduced signal from a disc-shaped information recording medium,
    means for detecting a type of detected defect,
    means for detecting a position of the detected defect in radial and circumferential directions,
    means for grouping the defects into clusters of defects by the detected positions,
    means for calculating dimensions of the defect cluster in radial and circumferential directions, and
    means for storing information regarding the type, position and dimensions of the detected defects or defect clusters.

2. A defect inspection apparatus as defined in claim 1 wherein said means for detecting defects includes means for measuring a duration of a dropout pulse representative of a detected defect, the duration of said dropout pulse corresponding to the circumferential dimension of said detected defect.

3. A defect inspection apparatus as defined in claim 1 wherein said means for detecting a type of detected defect includes means for classifying detected defects as user area defects, flag area defects, header errors and control track errors.

4. A defect inspection apparatus as defined in claim 3 wherein said means for detecting a type of detected defect further includes means for classifying control track errors into control track data errors and control track sync or resync errors.

5. A defect inspection apparatus as defined in claim 1 wherein said means for detecting a position of the detected defect includes means for determining an angle or sector of the detected defect and means for determining a track number of the detected defect.

6. A defect inspection apparatus as defined in claim 1 wherein said means for storing information includes memory means for storing size/type bits representative of the size and type of each detected defect, angle or sector bits representative of the circumferential position of each detected defect and track bits representative of the radial position of detected defect.

7. A defect inspection apparatus as defined in claim 1 wherein said means for grouping the defects into clusters of defects includes means for grouping detected defects on the same track or on contiguous tracks into a cluster of defects.

8. A defect inspection apparatus as defined in claim 7 wherein said means for grouping the defects into clusters of defects further includes means for grouping defects separated by less than a predetermined angle into a cluster of defects.

9. A defect inspection apparatus as defined in claim 1 wherein said means for calculating the dimensions of the defect cluster includes means for determining an inner track and an outer track of the defect cluster.

10. A defect inspection apparatus as defined in claim 9 wherein said means for detecting a position of the detected defect includes means for determining a center track of the defect cluster.

* * * * *